United States Patent
Turner et al.

(10) Patent No.: US 10,549,483 B2
(45) Date of Patent: Feb. 4, 2020

(54) SURFACES WITH TUNABLE ADHESION BASED ON COMPOSITE STRUCTURES AND METHODS OF MAKING THE SAME

(71) Applicant: The Trustees of the University of Pennsylvania, Philadelphia, PA (US)

(72) Inventors: Kevin Turner, Wayne, PA (US); Helen Minsky, Philadelphia, PA (US)

(73) Assignee: The Trustees of the University of Pennsylvania, Philadelphia, PA (US)

(*) Notice: Subject to any disclaimer, the term of this patent is extended or adjusted under 35 U.S.C. 154(b) by 69 days.

(21) Appl. No.: 15/311,536

(22) PCT Filed: May 28, 2015

(86) PCT No.: PCT/US2015/032871
§ 371 (c)(1),
(2) Date: Nov. 16, 2016

(87) PCT Pub. No.: WO2015/184088
PCT Pub. Date: Dec. 3, 2015

(65) Prior Publication Data
US 2017/0087763 A1    Mar. 30, 2017

Related U.S. Application Data

(60) Provisional application No. 62/003,988, filed on May 28, 2014.

(51) Int. Cl.
*B29C 65/48* (2006.01)
*B05D 3/00* (2006.01)
(Continued)

(52) U.S. Cl.
CPC ........... *B29C 65/48* (2013.01); *B05D 1/02* (2013.01); *B05D 3/007* (2013.01); *G03F 7/0002* (2013.01);
(Continued)

(58) Field of Classification Search
None
See application file for complete search history.

(56) References Cited

U.S. PATENT DOCUMENTS 7,927,976 B2 * 4/2011 Menard ................. B82Y 10/00
                                                          438/478
7,943,491 B2   5/2011 Nuzzo et al.
(Continued)

OTHER PUBLICATIONS

International Preliminary Report on Patentability and Written Opinion for International Application No. PCT/US2015/032871, dated Nov. 29, 2016, 9 pages.
(Continued)

*Primary Examiner* — Jeffrey D Washville
(74) *Attorney, Agent, or Firm* — BakerHostetler

(57) ABSTRACT

A structured composite surface includes a backing layer and a plurality of composite posts in contact with the backing layer, each composite post having a core made of a first material and an outer shell made of a second material, the outer shell is in contact with and surrounding the core, the core has a Young's modulus of at least 50 times greater than the outer shell. A method of transfer printing includes pressing a stamp including at least one composite post to a substrate, the at least one composite post having a core made of a first material and an outer shell made of a second material, the outer shell is in contact with and surrounding the core, the core has a Young's modulus at least 50 times greater than the outer shell, and retracting the stamp from the substrate by applying a shear load to the stamp.

4 Claims, 26 Drawing Sheets

(51) Int. Cl.
*G03F 7/038* (2006.01)
*G03F 7/16* (2006.01)
*G03F 7/20* (2006.01)
*G03F 7/26* (2006.01)
*B05D 1/02* (2006.01)
*G03F 7/00* (2006.01)
*B29L 31/00* (2006.01)

(52) U.S. Cl.
CPC ............ *G03F 7/0385* (2013.01); *G03F 7/162* (2013.01); *G03F 7/20* (2013.01); *G03F 7/26* (2013.01); *B29L 2031/756* (2013.01)

(56) References Cited

U.S. PATENT DOCUMENTS

2013/0071814 A1 3/2013 Boehner et al.
2013/0171337 A1 7/2013 Ko et al.

OTHER PUBLICATIONS

International Search Report for International Application No. PCT/US2015/032871 dated Aug. 14, 2015.

* cited by examiner

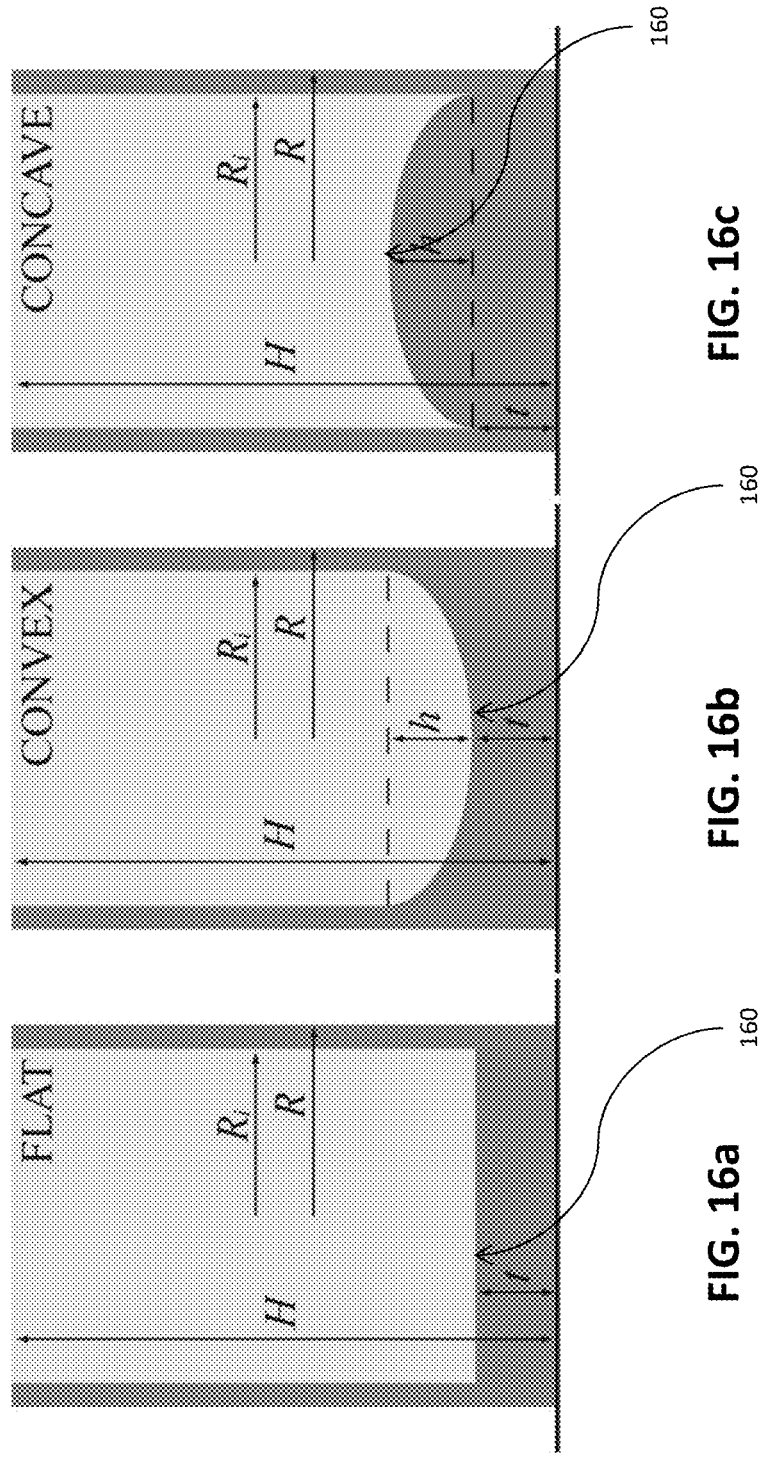

SURFACES WITH TUNABLE ADHESION BASED ON COMPOSITE STRUCTURES AND METHODS OF MAKING THE SAME

CROSS-REFERENCE TO RELATED APPLICATIONS

This application is a U.S. national phase application of International Application No. PCT/US2015/032871, filed May 28, 2015, which claims priority to U.S. Provisional application Ser. No. 62/003,988 entitled Surfaces with Tunable Adhesion Based on Composite Structures and Methods of Making the Same filed on May 28, 2014, the contents of which are incorporated fully herein by reference.

GOVERNMENT RIGHTS

This invention was made with government support under grant number 0845294 awarded by the National Science Foundation. The government has certain rights in the invention.

FIELD OF THE INVENTION

This invention relates to surfaces with tunable adhesion based on composite structures, processes for producing such surfaces, and the use of such surfaces for applications such as transfer printing.

BACKGROUND OF THE INVENTION

Tunable or switchable adhesion has a variety of applications including, e.g., the transfer printing of semiconductor elements, automated material handling, climbing robots, and medical tapes. There are a number of approaches relating to tunable adhesion, many of which include complex or difficult to manufacture geometries and/or the need for an external stimuli. Such approaches include variation of peeling speed, switching between modes of loading, structures with angled or asymmetric geometries, magnetic deformation, thermal actuation, humidity-driven changes, laser-based delamination, altering the real contact area through deformation, or a combination of these techniques.

For example, some schemes to achieve tunable adhesion have relied on fabricating posts or fibers with complex geometries, such as posts with mushroom-like caps. Fibrillar adhesives, which are often inspired by natural systems like the Gecko lizard or insects, use asymmetric post geometries to obtain adhesion control via peeling direction, similar to concepts in gecko adhesion. As one example, posts with one flattened side and one rounded side have been fabricated. When a shear load is applied to push the flat side into contact with the surface, a large contact area and high pull-off force are achieved. The opposite is true when shear load is used to push the rounded side into contact with the surface.

The mushroom-shaped geometry alters the stress distribution at the interface and shifts the peak stress from the edge of the post to the center of contact. This results in an increase in the force required to separate the post from the surface (i.e., the pull-off force) as it is more difficult to initiate a crack at the center than at the edge. However, tuning the adhesion of surfaces with mushroom-shaped posts can be difficult as the application of shear may not alter the stress distribution at the interface sufficiently to allow for a crack to initiate at the edge.

Thus, it would be useful to provide a tunable adhesive with a simple geometry that can be readily manufactured.

There is also a need for a tunable adhesive that does not require an external stimuli (e.g., magnetic, thermal, pneumatic) beyond the applied loading. Further, it would be desirable to provide a tunable adhesive that offers strong adhesion under normal loading and weak adhesion when shear is applied.

SUMMARY OF THE INVENTION

Aspects of the invention relate to composite posts, structured composite surfaces, methods for producing structured composite surfaces, and methods for transfer printing.

In accordance with one aspect, the invention provides a composite post. The composite post includes a core made of a first material and an outer shell made of a second material. The outer shell is in contact with and surrounds the core. The core has a Young's modulus of at least 50 times greater than the outer shell.

In accordance with another aspect, the invention provides a structured composite surface. The structured composite surface includes a backing layer and a plurality of composite posts in contact with the backing layer. Each composite post has a core made of a first material and an outer shell made of a second material. The outer shell is in contact with and surrounds the core. The core has a Young's modulus at least 50 times greater than the outer shell.

In accordance with yet another aspect, the invention provides a method for producing a structured composite surface. The method includes forming a plurality of posts of a first material onto a backing layer; forming a plurality of holes onto a mold layer; coating the plurality of holes with a second material to form a coated plurality of holes, wherein the first material has a Young's modulus at least 50 times greater than the second material; aligning the plurality of posts with the coated plurality of holes, such that the plurality of posts mate with the coated plurality of holes, to form a composite assembly; curing the composite assembly; and separating the composite assembly.

In accordance with still another aspect, the invention provides a method for producing a structured composite surface. The method includes forming a plurality of holes onto a mold layer; spray coating an outer shell material onto the plurality of holes to form a spray coated plurality of holes; coating the spray coated plurality of holes with a core material to form a plurality of composite posts, wherein the core material has a Young's modulus at least 50 times greater than the outer shell material; and attaching a backing layer to the plurality of composite posts.

Other aspects of the present invention include a method for transfer printing. The method includes pressing a stamp including at least one composite post to a substrate, the at least one composite post including a core made of a first material and an outer shell made of a second material, the outer shell in contact with and surrounding the core, the core having a Young's modulus at least 50 times greater than the outer shell; and retracting the stamp from the substrate by applying a shear load to the stamp.

BRIEF DESCRIPTION OF THE DRAWINGS

The invention is best understood from the following detailed description when read in connection with the accompanying drawings, with like elements having the same reference numerals. When a plurality of similar elements are present, a single reference numeral may be assigned to the plurality of similar elements with a small letter designation referring to specific elements. When referring to the elements collectively or to a non-specific one or more of the elements, the small letter designation may be dropped. This emphasizes that according to common practice, the various features of the drawings are not drawn to scale unless otherwise indicated. On the contrary, the dimensions of the various features may be expanded or reduced for clarity. Included in the drawings are the following figures:

FIG. 16a is a schematic representation of a composite post having a core with a flat bottom surface in accordance with aspects of the present invention;

FIG. 16b is a schematic representation of a composite post having a core with a convex bottom surface in accordance with aspects of the present invention;

FIG. 16c is a schematic representation of a composite post having a core with a concave bottom surface in accordance with aspects of the present invention;

DETAILED DESCRIPTION OF THE INVENTION

Figure 1B:
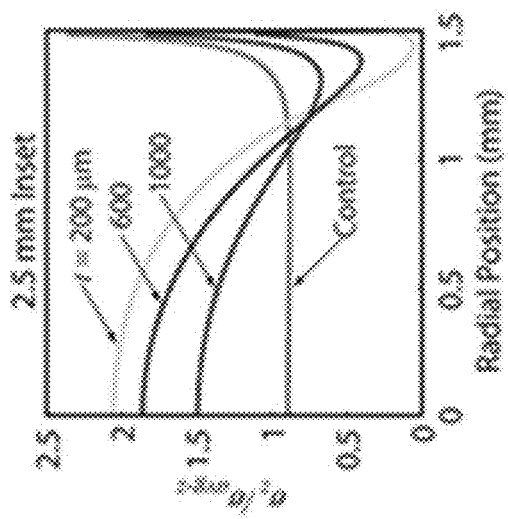
FIG. 1b is a graphical representation of the normal stress over average normal stress in accordance with aspects of the present invention.

Aspects of the invention relate to composite posts and structured composite surfaces. In accordance with one aspect, the invention provides a composite post. The composite post includes a core made of a first material and an outer shell made of a second material. The outer shell is in contact with and surrounds the core. The core has a Young's modulus of at least 50 times greater than the outer shell. In accordance with another aspect, the invention provides a structured composite surface. The structured composite surface includes a backing layer and a plurality of composite posts in contact with the backing layer. Each composite post has a core made of a first material and an outer shell made of a second material. The outer shell is in contact with and surrounds the core. The core has a Young's modulus at least 50 times greater than the outer shell.

Other aspects of the invention relate to methods for producing structured composite surfaces and methods for transfer printing. In accordance with one aspect, the invention provides a method for producing a structured composite surface. The method includes forming a plurality of posts of a first material onto a backing layer; forming a plurality of holes onto a mold layer; coating the plurality of holes with a second material to form a coated plurality of holes, wherein the first material has a Young's modulus at least 50 times greater than the second material; aligning the plurality of posts with the coated plurality of holes, such that the plurality of posts mate with the coated plurality of holes, to form a composite assembly; curing the composite assembly; and separating the composite assembly. In accordance with still another aspect, the invention provides a method for producing a structured composite surface. The method includes forming a plurality of holes onto a mold layer; spray coating an outer shell material onto the plurality of holes to form a spray coated plurality of holes; coating the spray coated plurality of holes with a core material to form a plurality of composite posts, wherein the core material has a Young's modulus at least 50 times greater than the outer shell material; and attaching a backing layer to the plurality of composite posts. Other aspects of the present invention include a method for transfer printing. The method includes pressing a stamp including at least one composite post to a substrate, the at least one composite post including a core made of a first material and an outer shell made of a second material, the outer shell in contact with and surrounding the core, the core having a Young's modulus at least 50 times greater than the outer shell; and retracting the stamp from the substrate by applying a shear load to the stamp.

The composite posts according to aspects of the invention have tunable adhesion. In particular, the inventive composite posts have relatively high surface adhesion under normal loading (e.g., up to 3.5 times the adhesion strength of a homogenous post) and relatively weak adhesion when shear load is applied, such that adhesion tuning can be achieved by controlling the applied loading (e.g., depending on the amount of shear displacement such that as the shear loading increases, the amount of adhesion decreases and when the shear loading decreases, the amount of adhesion increases).

As used herein, "shear," "shear force," and "shear displacement" refers generally to a force, movement or pressure applied to an object perpendicular to the axis of normal force.

Figure 1A:
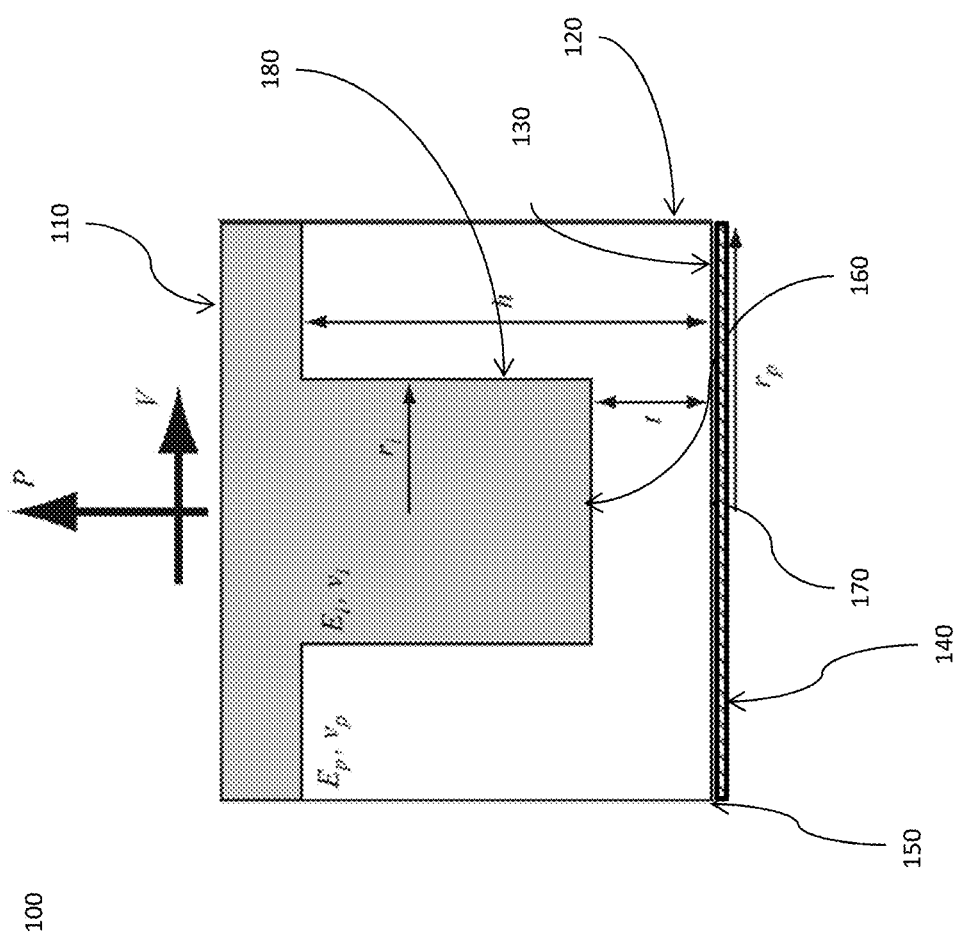
FIG. 1a is a schematic representation of a composite post in accordance with aspects of the present invention.

In FIG. 1a, a schematic of a single composite post 100 according to aspects of the invention is shown. Composite post 100 includes a core 110, which has a radius $r_i$, and an outer shell 120, which has a radius $r_p$. Outer shell 120 also has a thickness t, which is the distance between the bottom surface 160 of core 110 and the contact surface 130 of outer shell 120. Composite post 100 may be cylindrical or another geometry as will be apparent to one of ordinary skill in the art upon reading this disclosure. Contact surface 130 adheres to a substrate 140 primarily due to van der Waals adhesion.

Figure 1D:
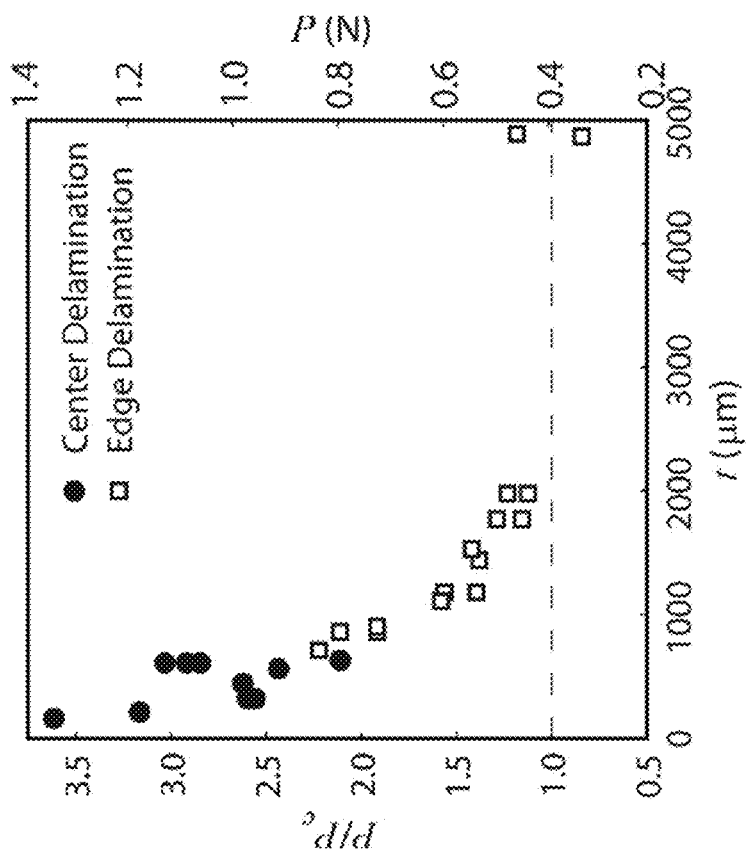
FIG. 1d is a graphical representation of the increase in adhesion achieved by composite posts in accordance with aspects of the present invention.
Figure 1C:
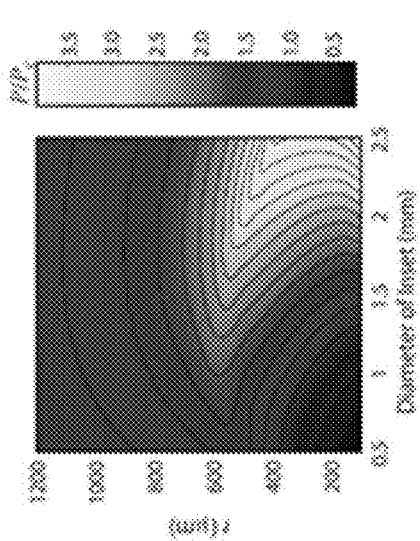
FIG. 1c is a graphical representation of the pull off force normalized to a post with no inset and an edge crack in accordance with aspects of the present invention.

It has now been found that the adhesion behavior of an interface can be tuned by altering the stress distribution at the interface through a composite structure. While not intending to be bound to a particular theory, the use of composite post 100 increases effective adhesion in at least two ways: (1) it prevents the crack from initiating at the edge 150 of contact surface 130 where there are defects that facilitate crack initiation at low stress levels; and (2) it reduces the peak stresses in the contact between composite post 100 and substrate 140. The stress distribution is a function of the radii of core 110 and outer shell 120 as well as the thickness t. As shown in FIG. 1b, the stress at edge 150 reduces and the peak stress shifts to the center 170 of contact surface 130 as thickness t is reduced. These stresses were predicted using finite element (FE) modeling. FIG. 1c depicts the FE predicted pull-off force, P, (normalized by the pull-off of a homogenous control post) of a 3 mmm dia. composite post as a function of core diameter and thickness t.

Figure 2B:
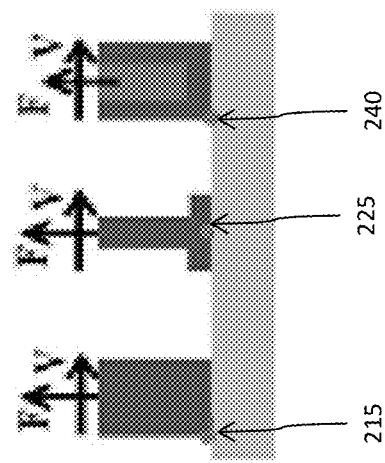
FIG. 2b is a schematic representation of posts with varying geometries subject to shear and normal loads.
Figure 2A:
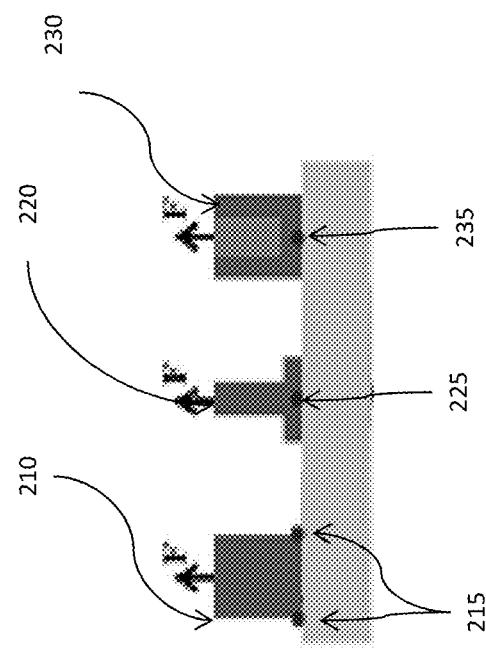
FIG. 2a is a schematic representation of posts with varying geometries subject to a normal load.

Turning now to FIG. 2a, the relationship of post geometry to the location of peak interface stress under normal loading is depicted. A homogenous post 210 subjected to normal force F has maximum interface stress at edges 215. Because the stress is highest at edges 215, a crack will initiate at edges 215 and propagate inward when the critical load (i.e., the pull-off force) is reached.

By contrast, mushroom-shaped post 220 and composite post 230, upon application of normal force F, exhibit maximum interface stress at centers 225 and 235 respectively. An increased force required to separate the post from the surface (i.e., the pull-off force) is required for mushroom-shaped post 220 and composite post 230 as compared to homogenous post 210, as it is more difficult to initiate a crack at the center than at the edge. By shifting peak stress away from the edge of composite post 230, the load is distributed more uniformly over the interface between composite post 230 and the substrate, thus increasing adhesion strength. It has now been found that the addition of a stiff core to create a composite post surprisingly may increase the pull-off force required for delamination of the post up to 3.5 times compared to a homogenous post having the same dimensions.

In general, applying a shear load while a post is in contact with a rigid surface lowers the pull-off force and controls the location of crack initiation as well as the direction of crack propagation. It also alters the stress distribution at the interface such that the stress along the leading edge increases, while the trailing side experiences lower stress. This phenomenon has been used in transfer printing to increase the reversibility of the adhesives.

When shear (depicted by the vector V) and normal load are concurrently applied to the same three posts, as depicted in FIG. 2b, the maximum interface stress remains at edge 215 and center 225 for homogenous post 210 and mushroom-shaped post 220. Surprisingly, however, the maximum interface stress shifts to edge 240 of composite post 230. The ability to shift the location of crack initiation for composite post 230 through selective loading desirably permits tuning of adhesion strength. Turning back to FIG. 1, composite post 100 provides strong adhesion under normal loading and weak adhesion when shear is applied. In particular, composite post 100 results in: (1) low stress at the edge under normal loading because core 110 shifts the peak stress to center 170; and (2) a high stress at edge 150 when shear is applied due to the overall stiffness of composite post 100. The composite post geometry thus provides both adhesion enhancement and adhesion tunability.

Adhesion tuning for, e.g., a mushroom-shaped post may be difficult as the application of shear may not alter the stress distribution at the interface sufficiently to allow for a crack to initiate at the edge.

Outer shell 120 may be constructed from a variety of polymeric and other materials. In one embodiment, outer shell 120 may be manufactured from a material or combination of materials having a low Young's modulus which allows it to conform to the roughness on various surfaces. In one embodiment, the outer shell has a Young's modulus E<~10 MPa, which permits van der Waals adhesion to a broad range of materials. For example, a silicone elastomer matrix (E~0.1-10 MPa) may be used for outer shell 120. While the widely used Sylgard 184 polydimethylsiloxane (PDMS) has an elastic modulus of about 2 MPa, the elastic modulus of PDMS, and silicone elastomers in general, can be tuned over a wide range by changing the cross-link density through formulation and curing conditions. Other suitable materials for outer shell 120 include, without limitation, butyl rubber and nitrile rubber, as well as other like materials that will become apparent to one of ordinary skill upon reading this disclosure.

Core 110 may be manufactured from a material that has a Young's modulus that is about at least a factor of 50 times stiffer than outer shell 120. The difference in Young's modulus between core 110 and outer shell 120 permits core 110 to effectively manipulate the stress field at the interface of contact surface 130 and substrate 140. Notably, the difference in Young's modulus permits both core 110 and outer shell 120 to be polymers. In one embodiment, core 110 is manufactured from polyimide (PIM) (E~1-3 GPa). PIM is available in sheet and wafer form and can also be deposited via spin-coating. Furthermore, PIM can be structured at the microscale either using reactive ion etching or directly via photolithography if a photodefinable formulation is used. Additional suitable materials for core 110 include, without limitation, quartz, glass, acrylic, silicon, SU-8, polyether ether ketone (PEEK), as well as other like materials that will become apparent to one of ordinary skill upon reading this disclosure.

Core 110 and outer shell 120 may desirably be selected from materials that will adhere together at interface 180 (either with or without an adhesion promoter). Another consideration in selecting these materials may be ease of manufacturing a given geometry (such as composite post 100).

Thickness t of outer shell 120 below core 110 is the thickness where the crack/delamination switches from initiating at the center to initiating at the edge upon application of shear load. FIG. 1d shows that t also assists in determining the increase in pull-off force. In particular, for posts with thin t, delamination will start in the center of the post, while for those with thicker t, a crack initiates along the edge. As shown by this figure, up to a 3.5× increase in adhesion may be observed for a composite post having a sufficiently small t. While the exact thickness may depend on the adhesion behavior at the particular interface (e.g., toughness, Γ, and critical stress, (max), it may be generally determined based on the radius $r_p$ of outer shell 120, where the ratio $t/r_p$ is less than about 0.45.

Figure 25B:
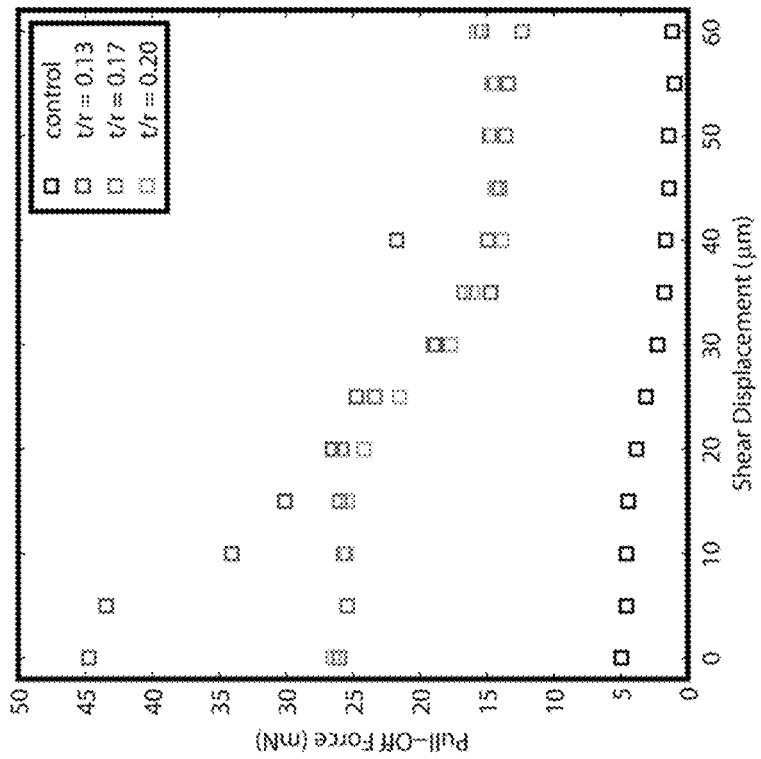
FIG. 25b is a graphical representation of the pull-off force vs. shear displacement for a composite post having a square post in accordance with aspects of the present invention.
Figure 25A:
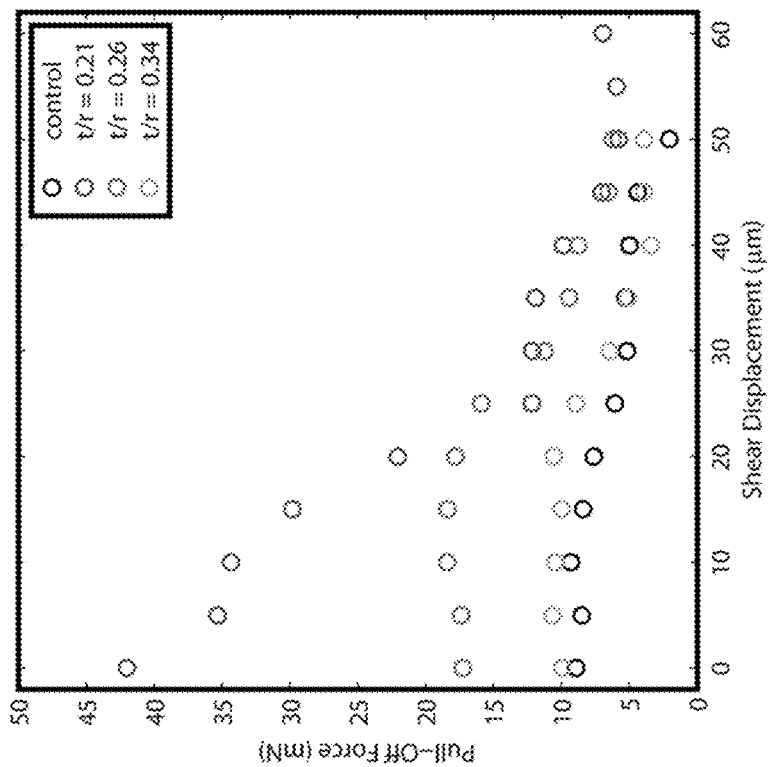
FIG. 25a is a graphical representation of the pull-off force vs. shear displacement for a composite post having a circular post in accordance with aspects of the present invention.

One of ordinary skill in the art will understand that composite post 100 can be manufactured to have a variety of cross-sectional geometries including, but not limited to, circular, square, rectangular, elliptical. Moreover, core 110 could have a different cross sectional geometry than composite post 100 as a whole. FIGS. 25a and b are graphical representations of the pull-off force vs. shear displacement for a composite post having, respectively, a circular and square post in accordance with aspects of the present invention. As shown, up to a 7× decrease in pull-off was achieved for circular post with shear displacement. Similarly, up to a 3× decrease in pull-off was achieved for square post with shear displacement. In general, a larger effect may be expected for posts with smaller t/r ratios.

Figures 18A, 18B, 18C:
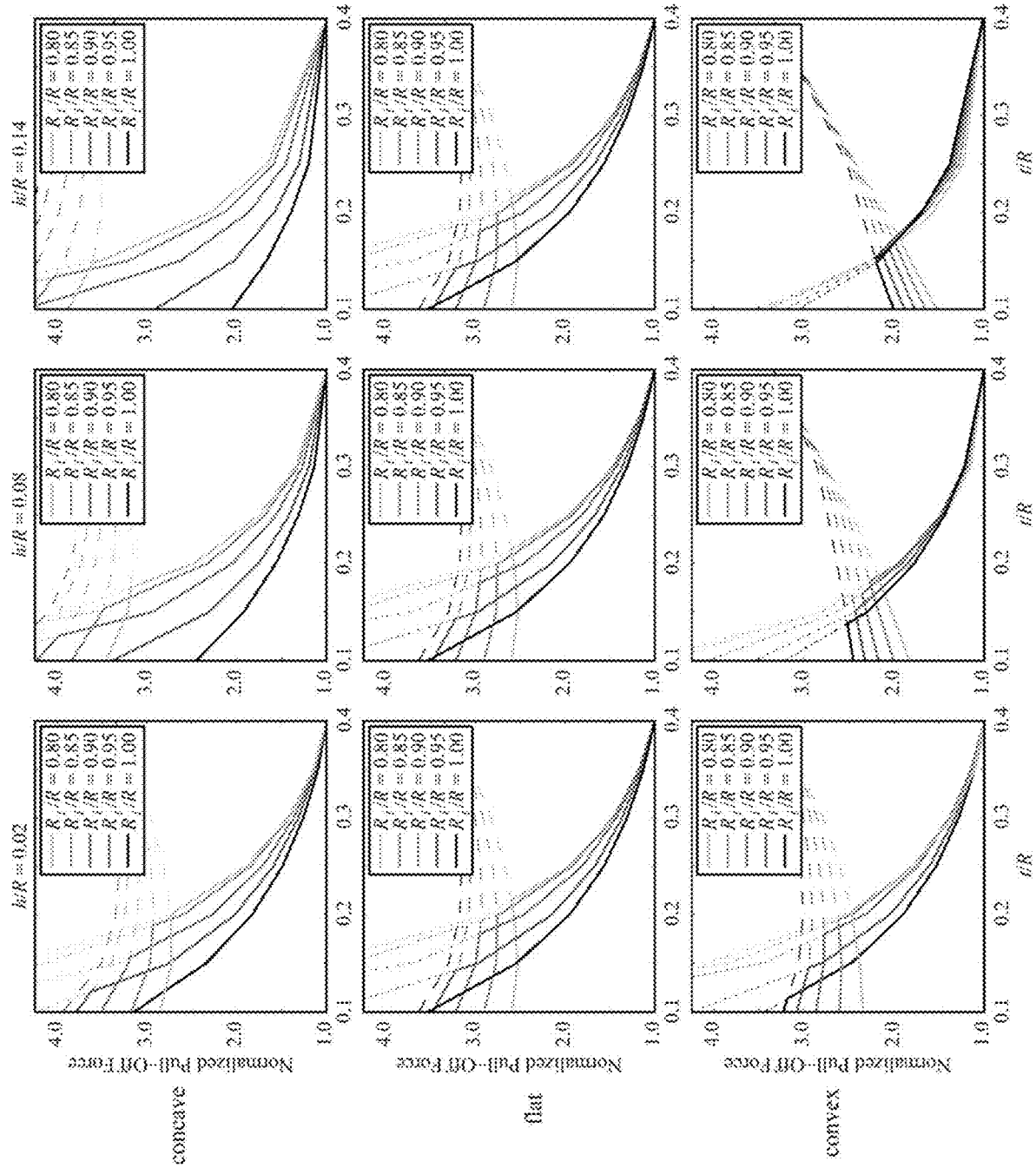
FIG. 18a is a graphical representation of the pull-off force for a composite post having a core with a concave bottom surface and varying h/R values in accordance with aspects of the present invention.
FIG. 18b is a graphical representation of the pull-off force for a composite post having a core with a flat bottom surface and varying h/R values in accordance with aspects of the present invention.
FIG. 18c is a graphical representation of pull-off force for a composite post having a core with a convex bottom surface and varying h/R values in accordance with aspects of the present invention.

The geometry of bottom surface 160 could also be altered to achieve different pull-off forces. FIGS. 16a-16c depict, respectively, composite posts having cores with flat, convex, and concave shaped bottom surfaces 160a, 160b, and 160c. FIGS. 17a-17c and 18a-c graphically depict the effect of the shape of the bottom surface of the core on the pull-off force. FIGS. 18a-18c are graphical representations of if the crack initiates at the edge or center for a cores having, respectively, concave, flat, and convex bottom surfaces and varying h/R values in accordance with aspects of the present invention.

Figure 19:
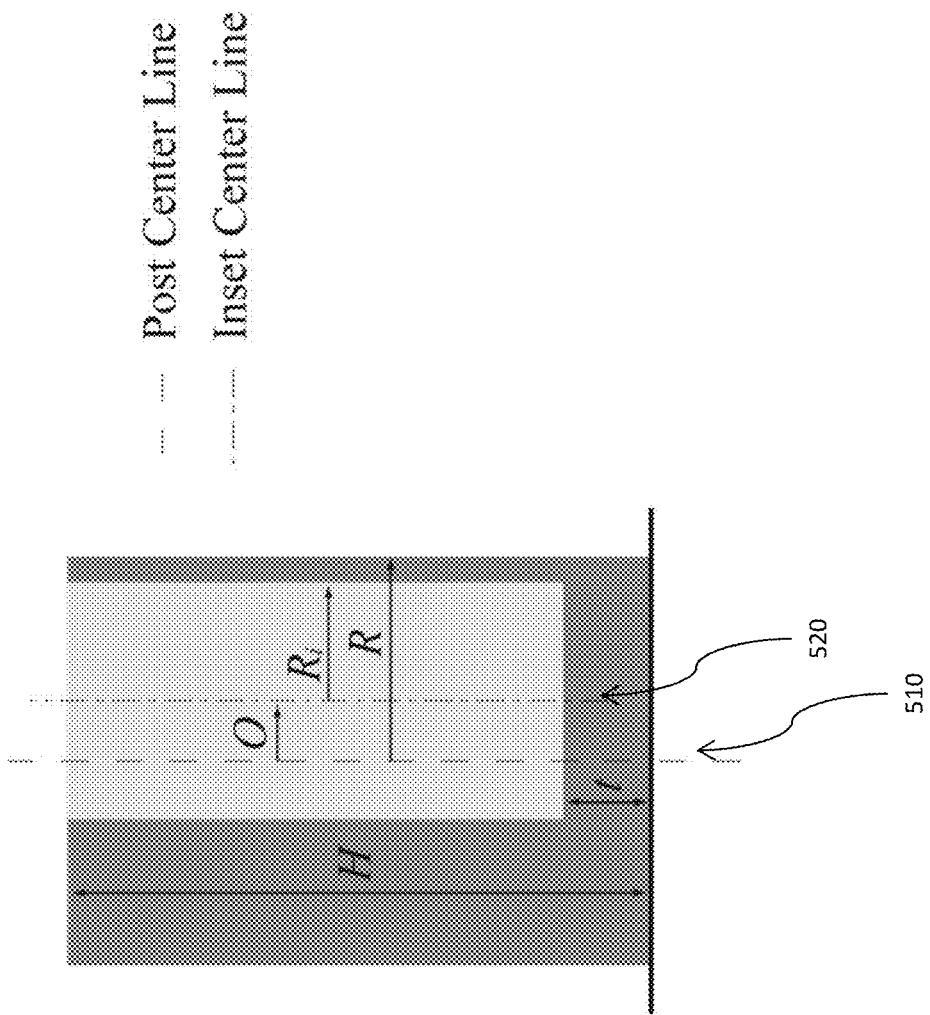
FIG. 19 is a schematic representation of a composite post having a core axial center line shifted from an outer shell axial center in accordance with aspects of the present invention.

In one embodiment, depicted by FIG. 19, composite post 500 includes a core axial (inset) centerline 520 and an outer shell axial (post) centerline 510. Core axial centerline 520 and outer shell axial centerline 510 may be superimposed or, as depicted, shifted from each other.

Figure 3:
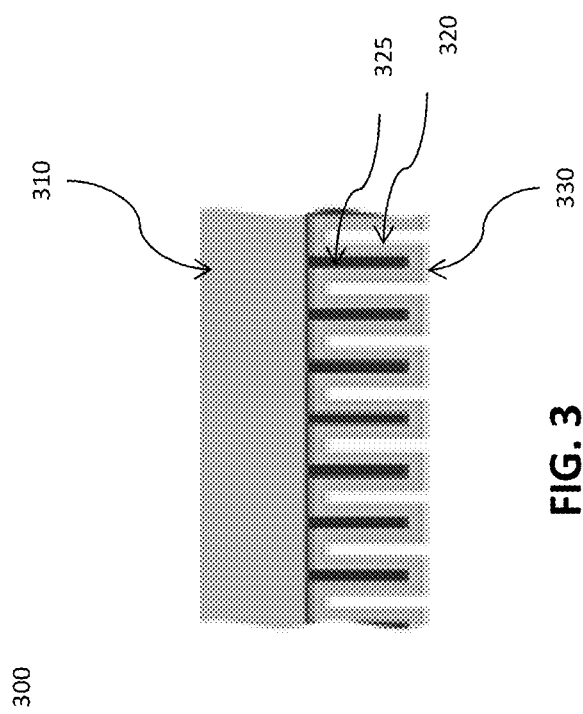
FIG. 3 is a schematic representation of a structured composite surface in accordance with aspects of the present invention.

In an alternative embodiment of the invention, a composite structure is provided. Turning to FIG. 3, the composite structure 300 includes a backing layer 310, which may be, e.g., a stiff material, such as glass, or a flexible material, such as a composite surface made of PDMS. Composite structure 300 also includes a plurality of composite posts 320, similar to composite post 100 in FIG. 1, in contact with backing layer 310. Each composite post 320 includes a core 325 and an outer shell 330.

Figure 4:
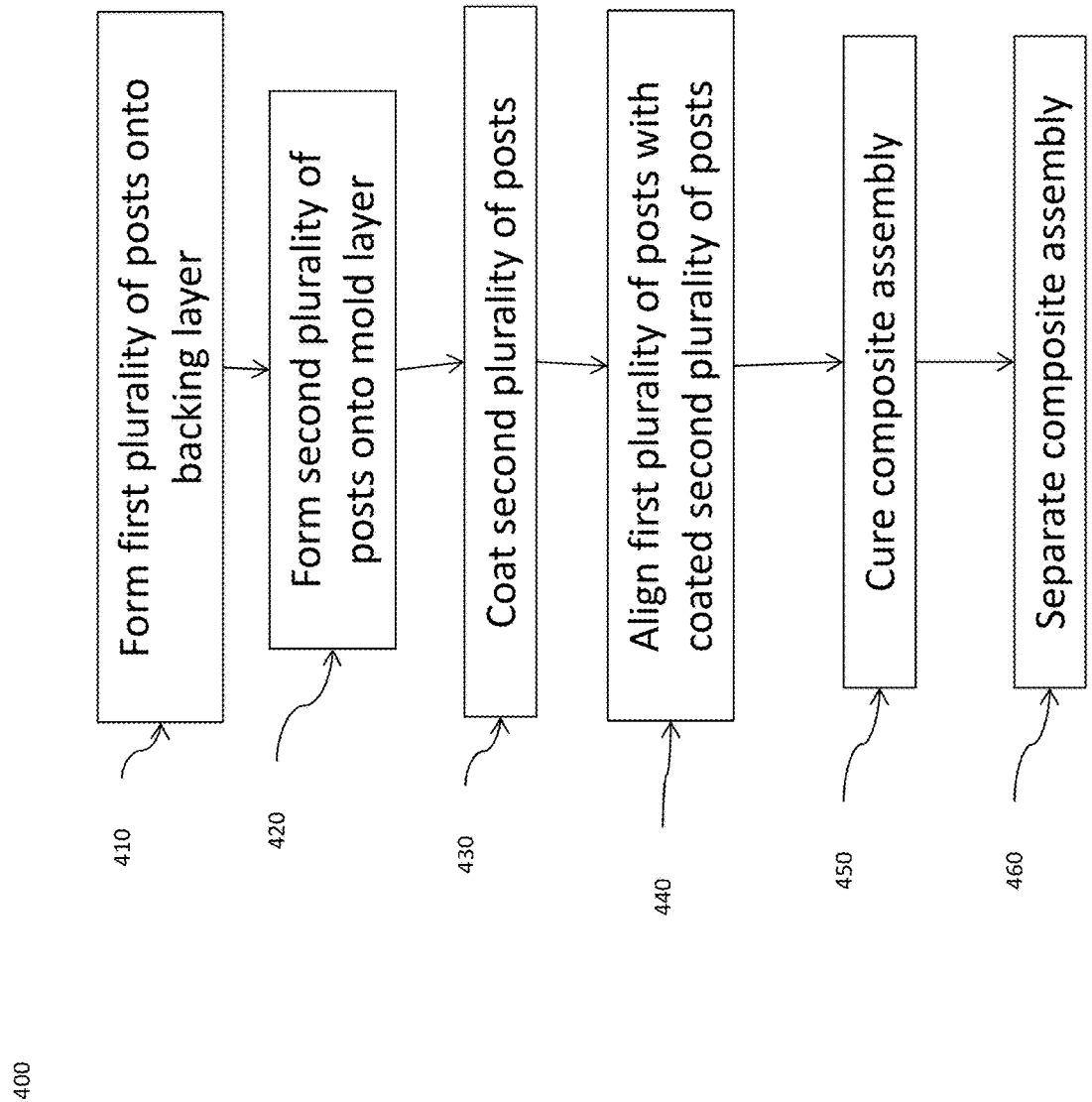
FIG. 4 is a process flow diagram for a method of producing a structured composite surface in accordance with aspects of the present invention.

In yet another embodiment, a method for producing a structured composite surface is provided. In FIG. 4, a flow diagram depicting selected steps of a process 400 for producing a structured composite surface is provided. It should be noted that, with respect to the methods described herein, it will be understood from the description herein that one or more steps may be omitted and/or performed out of the described sequence of the method while still achieving the desired result.

In step 410, a plurality of posts are formed onto a backing layer. The backing layer may be manufactured of a flexible material, such as PDMS, or inflexible material, such as glass backing. The plurality of posts are manufactured of a first material. The first material may be a material such as PIM (E~1-3 GPa). Additional suitable materials for the first material include, without limitation, quartz, glass, acrylic, silicon, SU-8, PEEK, as well as other like materials that will become apparent to one of ordinary skill upon reading this disclosure. In one embodiment, PIM posts are fabricated on the glass backing by spin coating a photodefinable PIM on the glass and patterning the PIM through a mask via photolithography.

In step 420, a plurality of holes are formed onto a mold layer. In one embodiment, the mold having the plurality of holes is formed from a suitable photoresist, such as SU-8, using photolithography. One of ordinary skill in the art will understand that the mold can be made from a variety of materials, including but not limited to photoresists (i.e. SU-8) or etched from a silicon wafer.

In step 430, the mold having the plurality of holes is coated with a second material. Suitable materials for the second material include a variety of polymeric and other materials. In one embodiment, the second material may be manufactured from a material or combination of materials having a low Young's modulus which allows it to conform to the roughness on various surfaces. In one embodiment, the outer shell has a Young's modulus $E<\sim10$ MPa, which permits van der Waals adhesion to a broad range of materials. For example, a silicone elastomer matrix ($E\sim0.1$-$10$ MPa), such as PDMS, may be used. Other suitable materials for the second material include, without limitation, butyl rubber and nitrile rubber, as well as other like materials that will become apparent to one of ordinary skill upon reading this disclosure.

Consistent with the teachings above, the first material may be manufactured from a material that has a Young's modulus that is about at least a factor of 50 times stiffer than the second material.

In step 440, the plurality of posts and the plurality of holes are aligned and assembled to form a composite assembly. The alignment and assembly may be done using a commercial semiconductor wafer bonding system, such as EVG 510/620 (manufactured by EVGroup, of Tempe, Ariz.).

In step 450, the second material may be cured by, e.g., heating the composite assembly.

Figure 5:
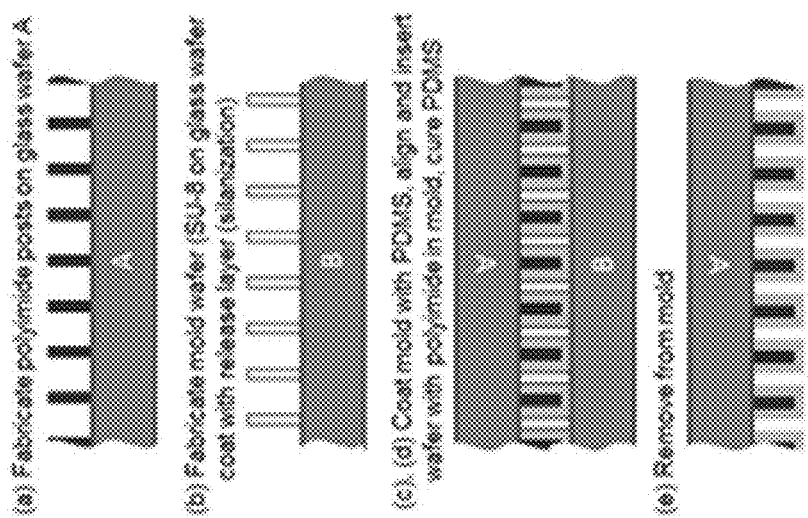
FIG. 5 is an illustration of certain steps of the process flow diagram of FIG. 4 in accordance with aspects of the present invention.

In step 460, the composite assembly is separated to leave the structured post surface. The structured surface, as shown in FIG. 3, includes a plurality of composite posts 320, similar to composite post 100 in FIG. 1, in contact with backing layer 310. Each composite post 320 includes a core 325 made of the first material and an outer shell 330 made of the second material. FIG. 5 pictographically presents certain steps of the process 400.

Figure 6:
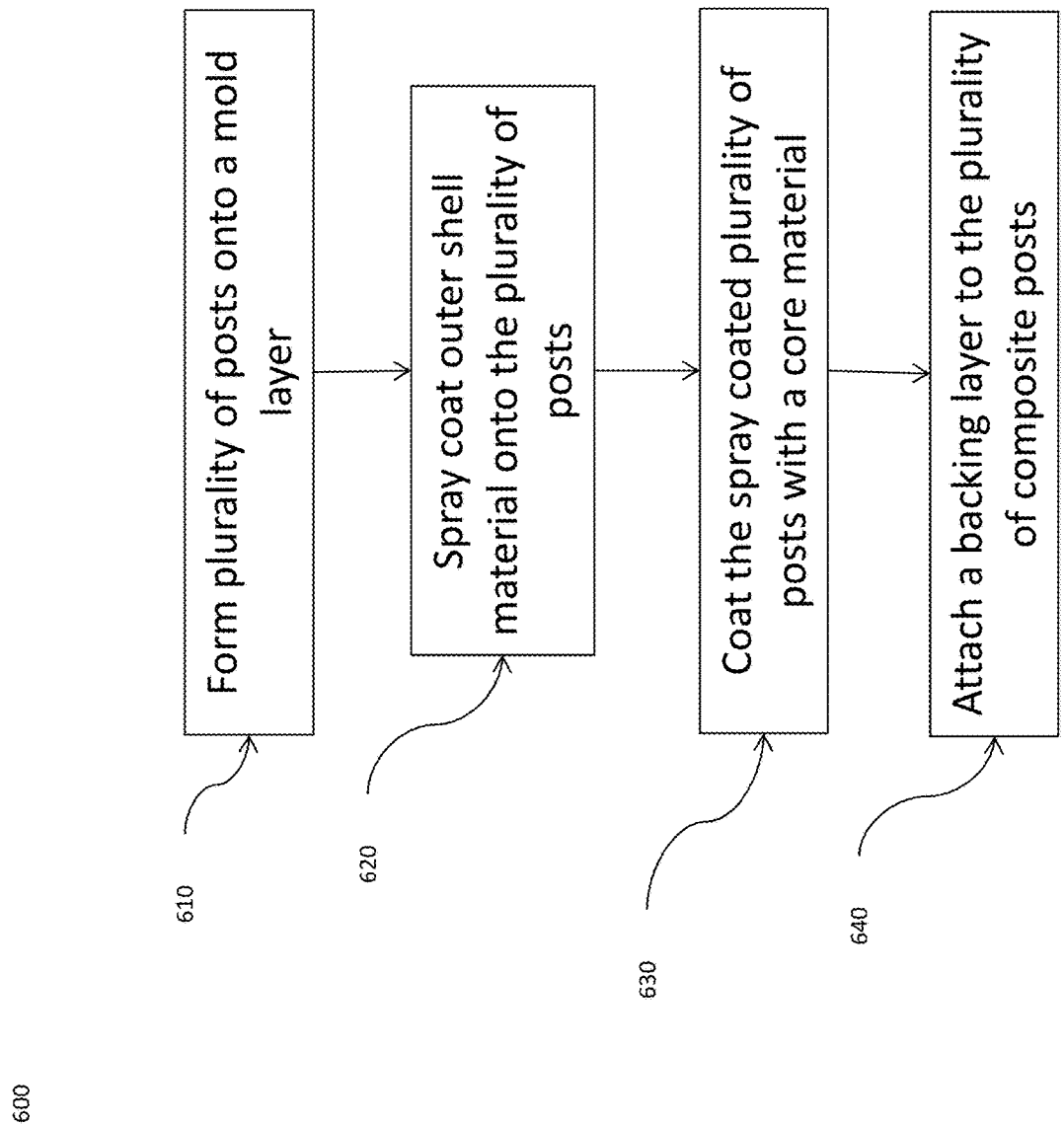
FIG. 6 is a process flow diagram for a method of producing a structured composite surface in accordance with aspects of the present invention.

In still another embodiment, a method for producing a structured composite surface is provided. In FIG. 6, a flow diagram depicting selected steps of an alternative process 600 for producing a structured composite surface is provided.

In step 610, a plurality of holes are formed onto a mold layer. In one embodiment, the mold layer having a plurality of holes is formed by spin-coating SU-8 and patterning via photolithography. One of ordinary skill in the art will understand that the mold layer having a plurality of holes can be made from a variety of materials, including but not limited to photoresists (i.e. SU-8) or etched from a silicon wafer.

In step 620, the mold is spray coated with an outer shell material to form a spray coated plurality of holes. Suitable materials for the outer shell material include a variety of polymeric and other materials. In one embodiment, the outer shell material has a low Young's modulus which allows it to conform to the roughness on various surfaces. For example, a silicone elastomer matrix ($E\sim0.1$-$10$ MPa), such as PDMS, may be used. Other suitable materials for the outer shell material include, without limitation, butyl rubber and nitrile rubber, as well as other like materials that will become apparent to one of ordinary skill upon reading this disclosure. The thickness of the spray coating is desirably the thickness of the resulting outer shell.

In step 630, the spray coated plurality of holes is coated with a core material. The core material may be a material such as PIM ($E\sim1$-$3$ GPa). Additional suitable materials for the first material include, without limitation, quartz, glass, acrylic, silicon, SU-8, PEEK, as well as other like materials that will become apparent to one of ordinary skill upon reading this disclosure. In one embodiment, PIM is the core material.

After coating, excess outer shell or core material may be removed via, e.g., a doctor blade, and the composite material may be cured.

Figure 7:
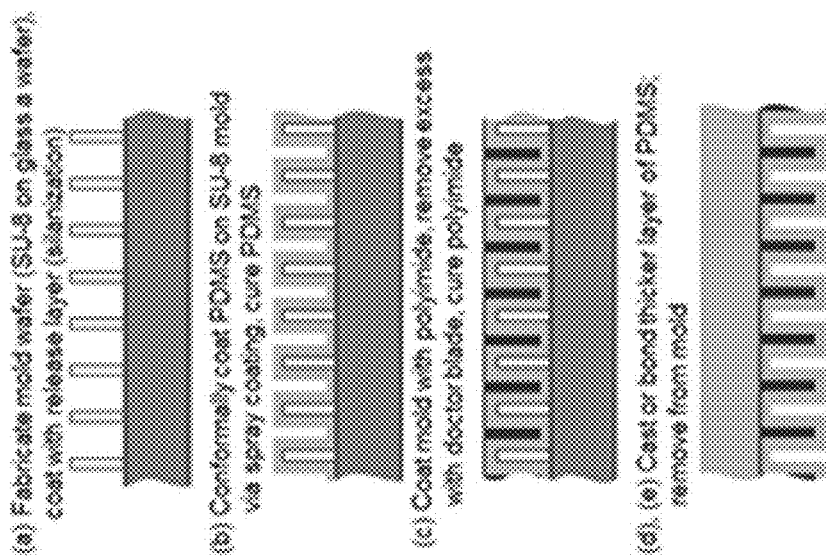
FIG. 7 is an illustration of certain steps of the process flow diagram of FIG. 6 in accordance with aspects of the present invention.

In step 640, a backing layer may be cast prior to removing the entire structure from the mold. One of ordinary skill in the art will understand that the backing layer may be formed in the mold along with the composite posts, or separately from the mold and then adhered to the composite posts. In one embodiment, a thick layer of PDMS serves as the backing layer. FIG. 7 pictographically presents certain steps of the process 600.

A secondary backing sheet may be bonded to the backing layer, such as a stiff Kapton™ backing sheet.

Figure 8:
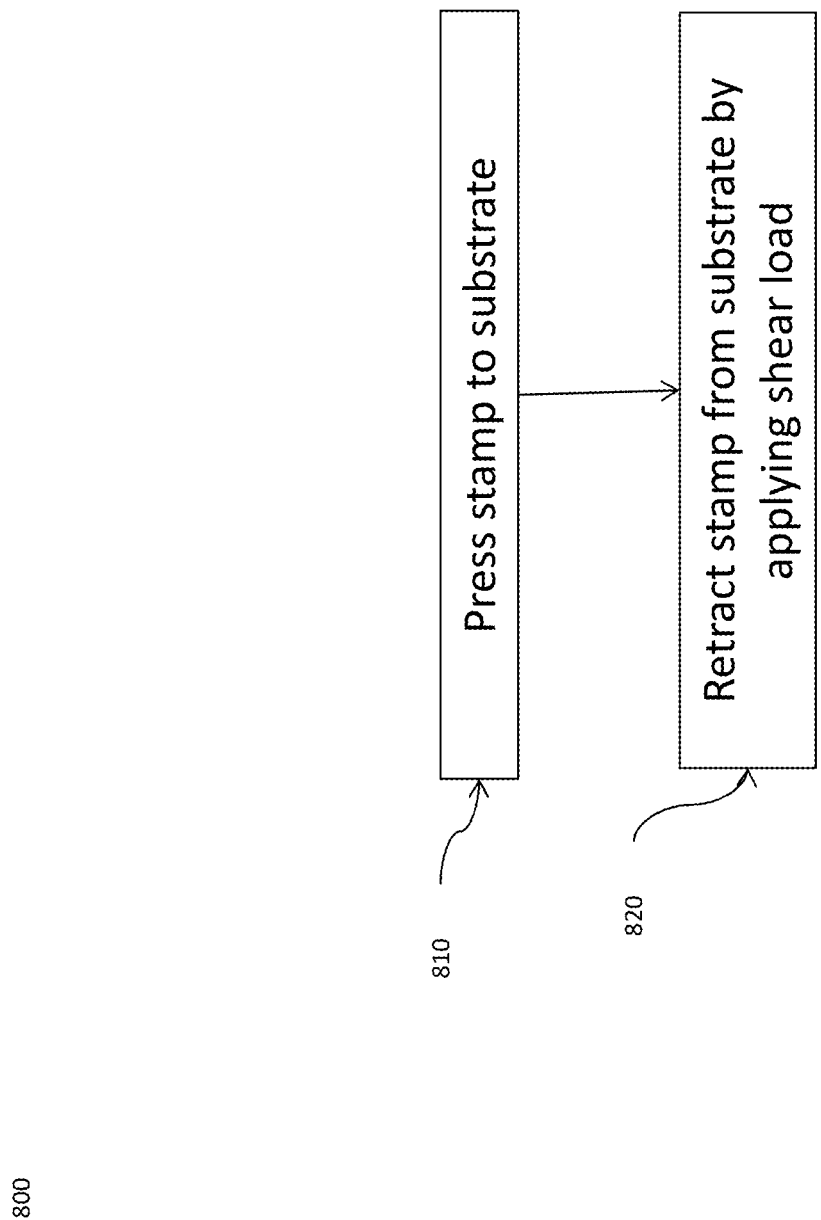
FIG. 8 is a process flow diagram for a method of transfer printing in accordance with aspects of the present invention.

In still another embodiment, a method of transfer printing is provided. In FIG. 8, a flow diagram depicting selected steps of a process 800 for transfer printing using the inventive composite posts is provided.

In step 810 a stamp including at least one composite post is pressed to a substrate. Consistent with the above disclosure, the at least one composite post having a core comprised of a first material and an outer shell comprised of a second material, the outer shell in contact with and surrounding the core, the core having a Young's modulus at least 50 times greater than the outer shell. In one embodiment, the substrate is a donor surface, such as a wafer having a layer to be transferred, and the stamp is adhered to the layer to be transferred through application of normal force. The layer may be, e.g., a silicon membrane.

In step 820, the stamp is retracted from the substrate by applying a shear load to the stamp.

Figure 9:
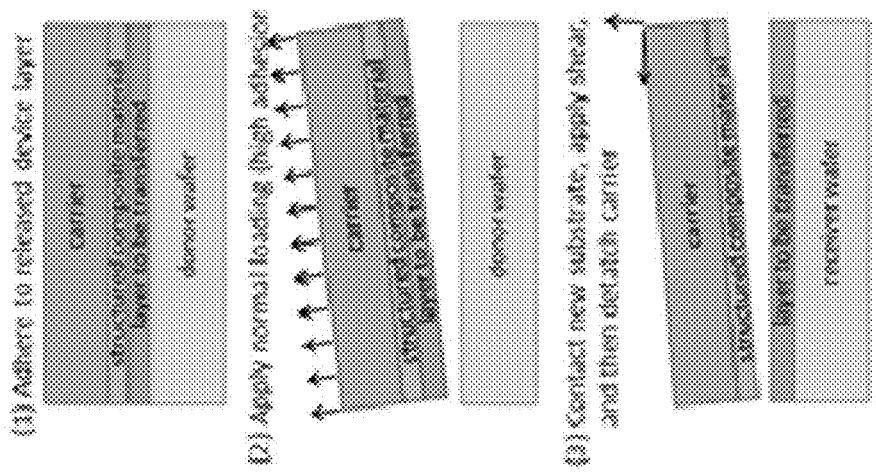
FIG. 9 is an illustration of certain steps of the process flow diagram of FIG. 8 in accordance with aspects of the present invention.

In another embodiment, the stamp is retracted after the layer to be transferred is adhered to a receiver surface. The layer to be transferred may be adhered to the receiving wafer in any manner available to one of ordinary skill in the art including, e.g.; etching. Application of shear detaches the stamp including the composite posts from the layer to be transferred. FIG. 9 pictographically presents certain steps of the process 800.

Figure 20:
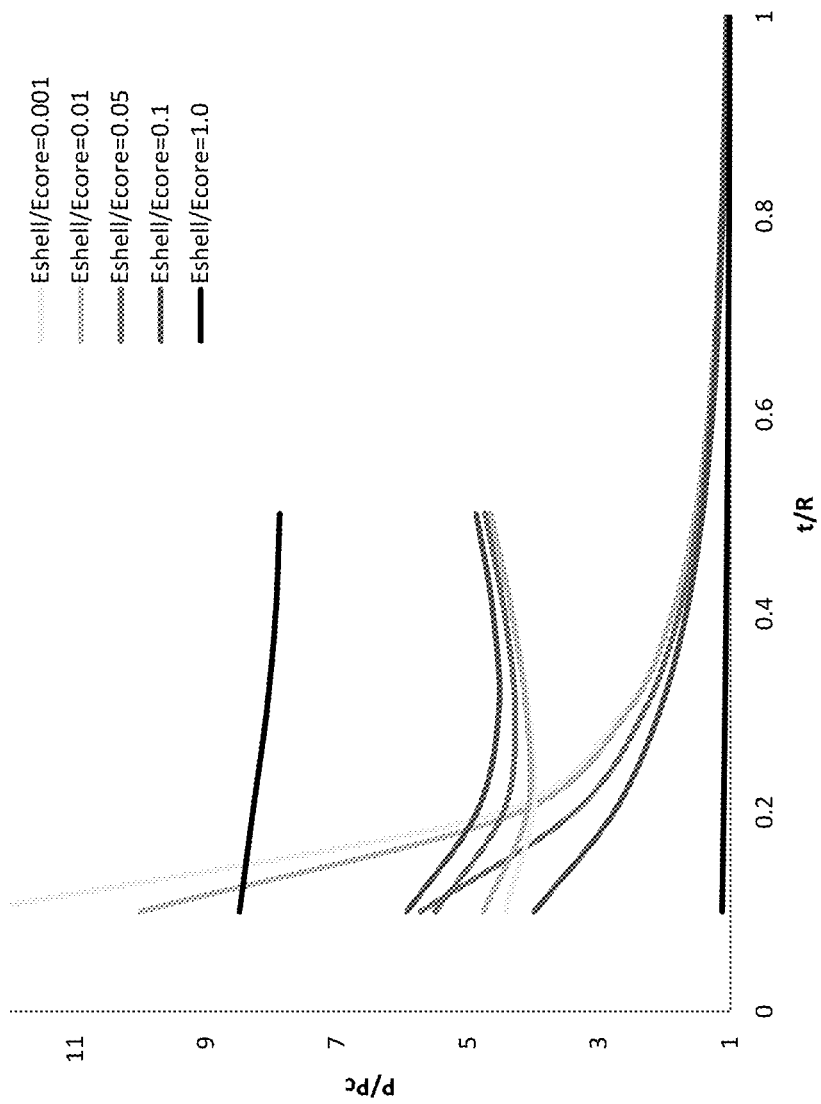
FIG. 20 is a graphical representation of the effect of the elastic modulus ratio between the core and the outer shell in accordance with aspects of the present invention.

FIG. 20 is a graphical representation of the effect of the elastic modulus ratio between the core and the outer shell in accordance with aspects of the present invention. FIG. 20 demonstrates that there is an ideal ratio of $E_{shell}/E_{CORE}$ depending on the t/R and $R_i/R$ ratios. Where $t/r<0.2$, $E_{shell}/E_{core}=0.05$ is ideal. Where $t/r>0.2$, $E_{shell}/E_{core}=0.01$ or $0.001$ is ideal. Here, the following are held constant: $v_{shell}=0.49$, $v_{core}=0.35$ and $R_i/R=0.9$.

Figure 21:
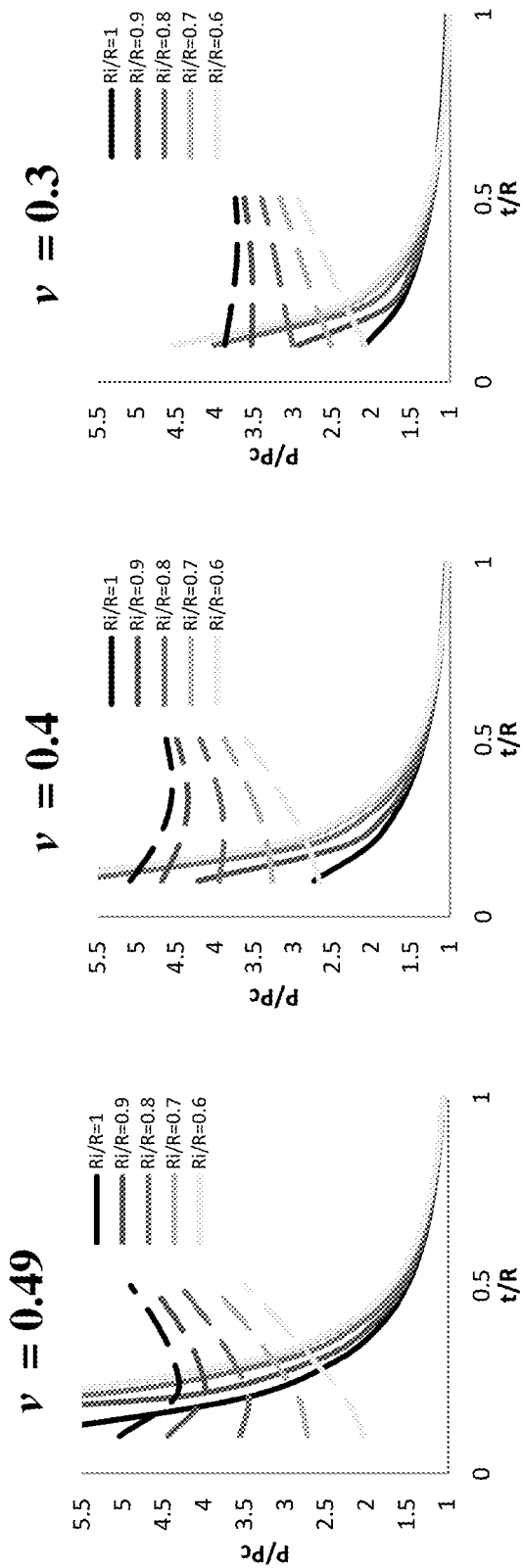
FIG. 21 is a graphical representation of the effect of Poisson's ratio of the outer shell on the performance of the geometry of the composite post in accordance with aspects of the present invention.
Figure 22B:
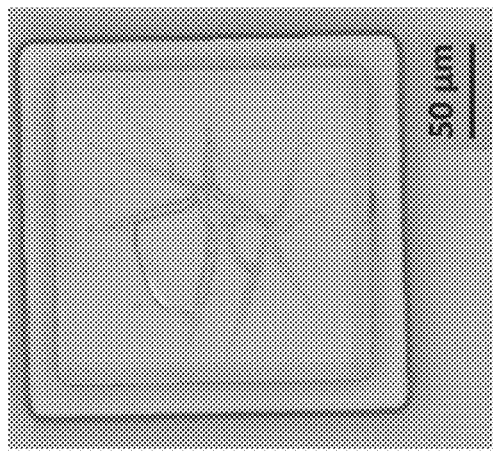
FIG. 22b is a photograph of a composite post in accordance with aspects of the present invention.
Figure 22D:
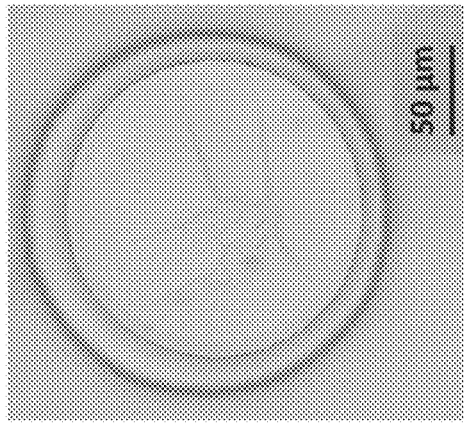
FIG. 22d is a photograph of a composite post in accordance with aspects of the present invention.
Figure 22A:
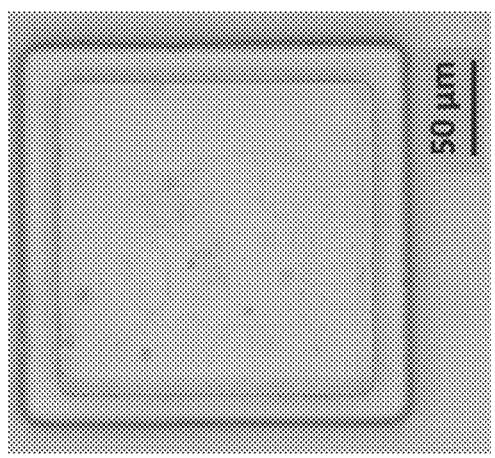
FIG. 22a is a photograph of a composite post in accordance with aspects of the present invention.
Figure 22C:
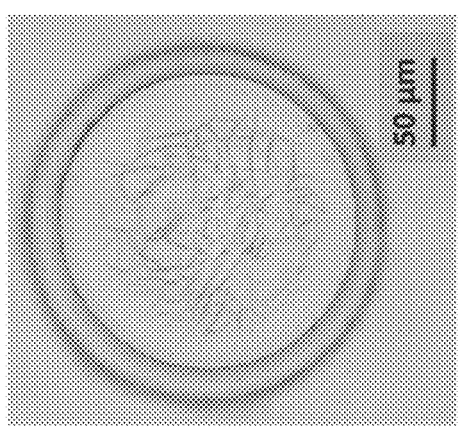
FIG. 22c is a photograph of a composite post in accordance with aspects of the present invention.

FIG. 21 is a graphical representation of the effect of Poisson's ratio of the outer shell on the performance of the geometry of the composite post in accordance with aspects of the present invention. FIG. 21 demonstrates that there is an ideal ratio of $v_{shell}$ depending on the t/R and RJR ratios. For $R_i/R=0.8$, $v_{shell}=0.4$, results in the highest pull-off forces for low t/R ratios. For $R_i/R=0.9$, $v_{shell}=0.49$, results in the highest pull-off forces generally. Here, $E_{shell}=2.1$ MPa, $E_{core}=2100$ MPa and $v_{core}=0.35$. Dashed lines represent center cracks, solid lines are edge cracks.

FIGS. 22*a*-*d* are optical photographs of composite posts in accordance with aspects of the present invention. The photographs show both the core and outer shell. Crack-like features are visible, however they are not on the contacting surface and do not appear to affect the adhesion performance. The crack-like features are believed to be at an interface beneath the surface.

Figure 23B:
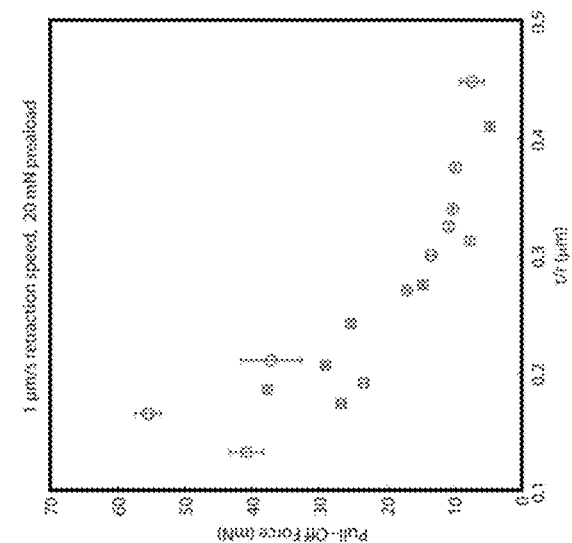
FIG. 23b is a graphical representation of the effect of varying the t/r ratio at a constant retraction speed in accordance with aspects of the present invention.
Figure 23C:
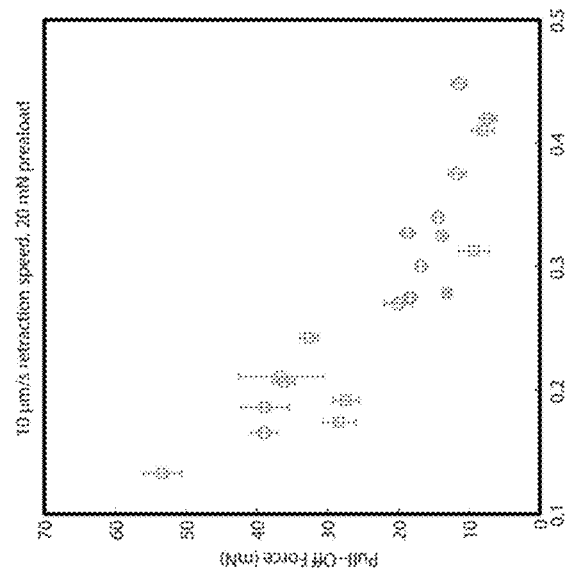
FIG. 23c is a graphical representation of the effect of varying the t/r ratio at a constant retraction speed in accordance with aspects of the present invention.
Figure 23A:
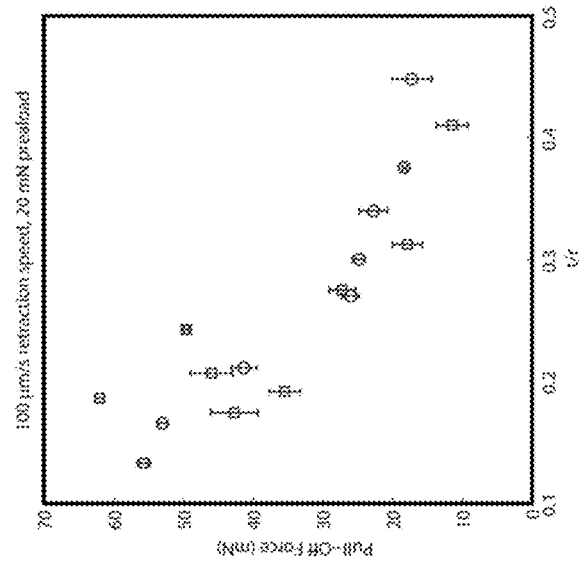
FIG. 23a is a graphical representation of the effect of varying the t/r ratio at a constant retraction speed in accordance with aspects of the present invention.

FIGS. 23a-c are graphical representations of the effect of varying the t/r ratio at different retraction speeds in accordance with aspects of the present invention. The adhesion in these figures was measured under pure normal loading. As shown, a decrease in t/r is accompanied by an increase in pull-off force. In general, higher retraction speeds are associated with higher pull-off forces.

Figures 24A, 24B, 24C:
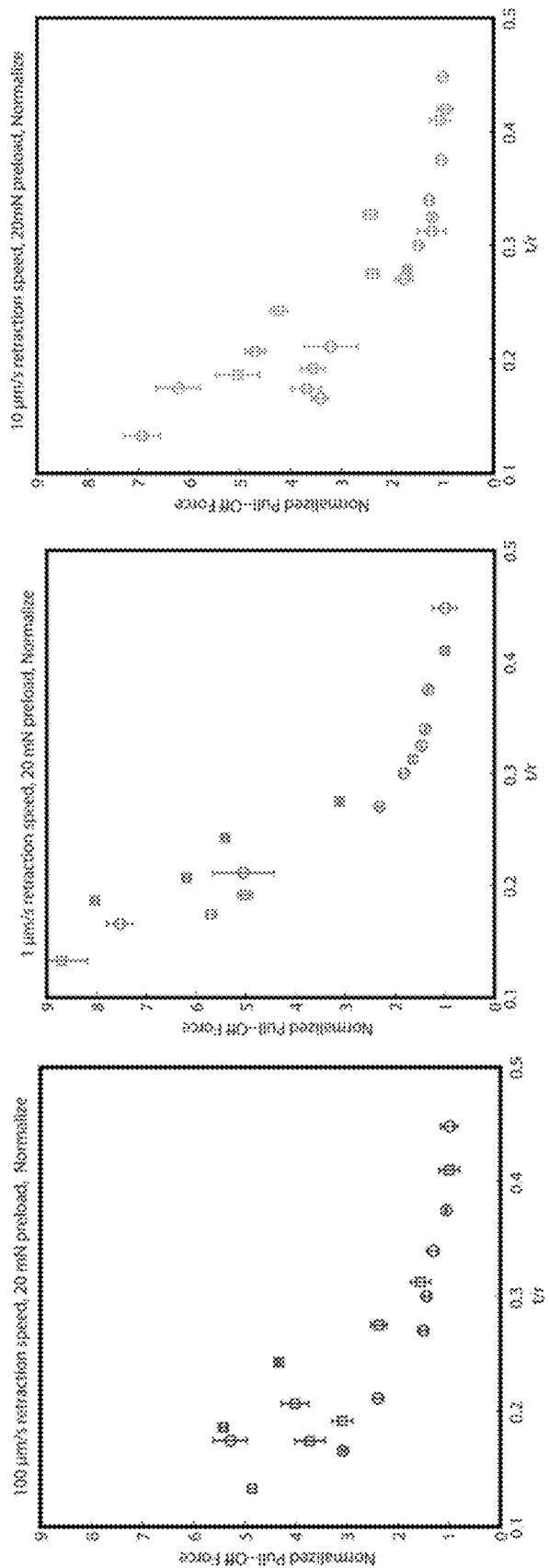
FIG. 24a is a normalized graphical representation of the effect of varying the t/r ratio at a constant retraction speed in accordance with aspects of the present invention.
FIG. 24b is a normalized graphical representation of the effect of varying the t/r ratio at a constant retraction speed in accordance with aspects of the present invention.
FIG. 24c is a normalized graphical representation of the effect of varying the t/r ratio at a constant retraction speed in accordance with aspects of the present invention.

FIGS. 24a-c are normalized graphical representations of the effect of varying the t/r ratio at a different retraction speeds in accordance with aspects of the present invention. There is greater than an 8× increase in pull-off force for posts with small t/r compared to a control post at 1 μm/s retraction speed. At higher retraction speeds a 5× increase in pull-off force may be observed as compared to a control post.

EXAMPLES

The following examples are included to demonstrate the overall nature of the present invention. The examples further illustrate the improved results obtained by employing the amphiphilic particles and related processes.

Example 1—Manufacturing and Characterization of Composite Posts

Figure 10:
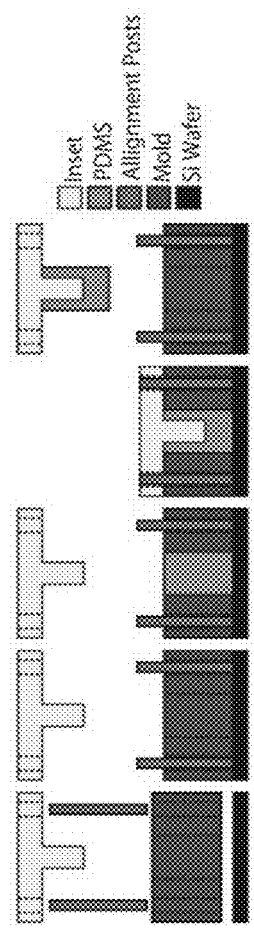
FIG. 10 depicts a molding apparatus and production of composite posts in accordance with aspects of the present invention.

To demonstrate that adhesion enhancement can be achieved in real systems, composite posts as shown in FIG. 10 were manufactured. The insets, which are attached to stiff backing layers, and the molds are machined. A silicon wafer having a uniform and flat contacting surface was used. To prevent PDMS from leaking, the mold which has been treated with Trichloro(1H,1H,2H,2H-perfluorooctyl) silane (Sigma Aldrich, St. Louis, Mo.) to facilitate release, was mechanically clamped into contact with the silicon wafer. PDMS was made using a mixing ratio of 10:1 weight ratio of Sylgard 184 base elastomer to Sylgard 184 curing agent (Dow Corning Corporation, Midland, Mich.). After a 30 minute degassing, PDMS was deposited into the mold and degassed for an additional 30 minutes. The insets, which have been treated with 1200 OS primer (Dow Corning, Midland, Mich.) to enhance adhesion to PDMS, were then inserted into the mold and clamped into place. The posts were cured at 85° C. for 4 hours in a vacuum oven. Once cooled, the posts were removed from the mold.

The general geometry of the PDMS post is a cylinder with a diameter of 3 mm and a height of 6.4 mm. Core/inset diameters were 2.5 mm and the range of t is between 100 and 1500 μm.

The adhesion (pull-off force) of the posts to a glass substrate under normal and shear loading was measured in a custom small-scale testing/indentation system. A glass slide was fixed to an x-y translation stage atop a tip-tilt platform and a post was mounted on a load cell with a 5 lb range (Cooper Instruments and Systems, Warrenton, Va.) on a vertically mounted translation stage (Zaber Technologies, Vancouver, British Columbia) above the slide. Images were taken with a CMOS (1024×1280) camera (Pixelink A741, Ottowa, Ontario) through an inverted microscope with a 2.5× objective positioned beneath the glass slide. The slide was aligned such that the post came into contact with it evenly. For the pure normal tests, a post was brought into contact with the slide at a speed of 0.2 μm/s until a preload of 0.3 N was reached, at which point the post was held in place for 20 seconds, and then retracted at a speed of 2 μm/s. The pull-off force was measured by the load cell as the peak force during retraction. During the shear tests a displacement in the x direction was applied manually using a micrometer driven stage during the ' hold' step. After application of shear, the post was retracted and pull-off force is measured.

FIG. 1d shows pull-off forces under normal loading for the 3 mm diameter composite posts with different layer thicknesses beneath the inset. The pull-off force values are normalized by the measured pull-off force of a control post that does not contain an inset. The data demonstrates that the composite geometry results an adhesion enhancement of up to 3.5, which is consistent with the FE results as shown in FIG. 1c. Furthermore, from optical observations of the contact during testing, the mode of failure (center or edge delamination) for each test was determined—this is indicated in the FIG. 1d by the different markers. Consistent with FE model predictions discussed earlier, the site of crack initiation shifts from the edge to the center as the thickness of layer beneath the inset is reduced.

Figure 11B:
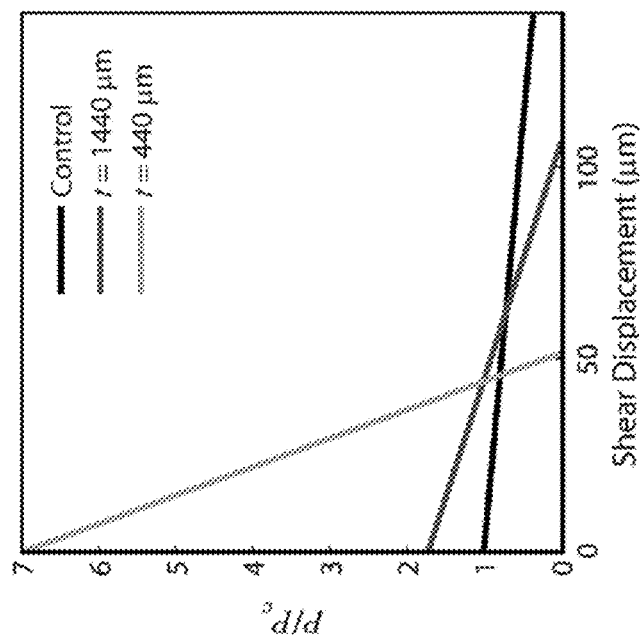
FIG. 11b is a graphical representation of normalized pull-off force as a function of shear displacement for various thicknesses of t in accordance with aspects of the present invention.
Figure 11A:
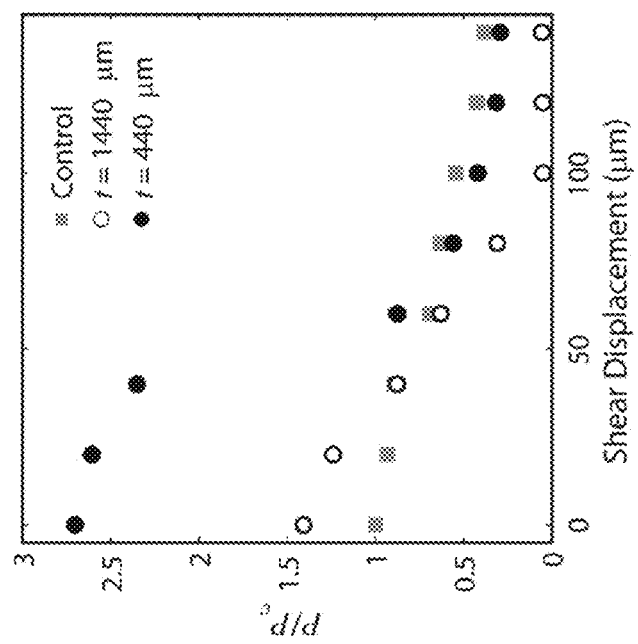
FIG. 11a is a graphical representation of the normalized pull-off force compared to shear displacement in accordance with aspects of the present invention.

FIG. 11a shows experimental results that demonstrate the ability to control adhesion through shear. As the shear displacement is increased, the force required to separate the contact decreases. In particular, for a control post the difference between the force required for separation under normal loading and shear loading is about a factor of two, while for the composite post, there is more than a 5-fold difference in the range examined here. The control posts displayed a linear relationship between shear displacement and pull-off force where the pull-off was decreased by half if the shear displacement was 110 μm. The entire face of the control post remained in conformal contact with the glass slide for all shear displacements tested (up to 140 μm). Furthermore, FE results (FIG. 11b) suggest that an even more significant reduction in adhesion may be able to be achieved through the application of shear.

The posts with thicker t (t>710 μm), displayed a linear relationship between shear displacement and pull-off force. Posts of this type are represented by the post with t=1440 μm. Under a pure normal load this sample required a higher pull-off force than the control, however if at least 40 μm of shear displacement were applied, the post with the insets required less pull-off force than the control posts. If at least 100 μm shear displacement is applied the post will delaminate with negligible pull-off force.

The posts with t<630 μm behaved in a more complicated fashion when a shear displacement was applied. These posts are represented t=440 μm. There was a significant drop in pull-off force when 40-70 μm of shear displacement was applied. However, after this drop off the pull-off decreased at about the same rate as the control case as shear displacements were applied.

Figure 12:
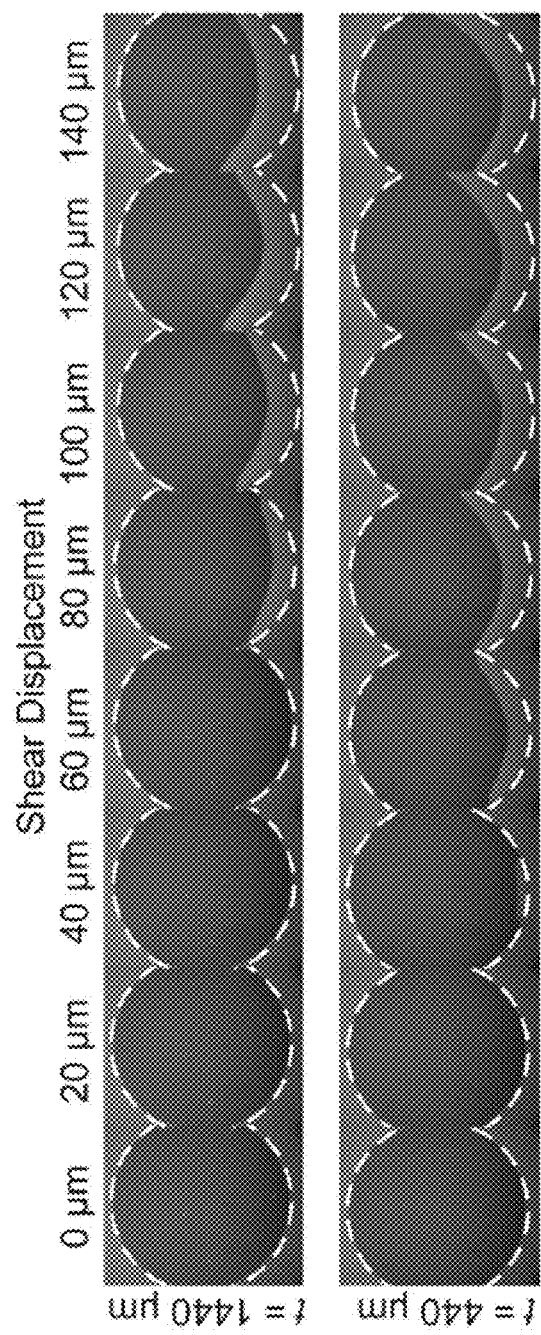
FIG. 12 is a series of photos of the contacting interface of posts as varying amounts of shear displacement is applied in accordance with aspects of the present invention.

Visual comparisons of the two posts, with t=440 μm and t=1440 μm, under shear loading are depicted in FIG. 12. The area of the post that stays in contact with the glass varies between the two posts. When t is thinner, more of the PDMS directly below the post stays in contact during shear displacement, however the PDMS around the outside of the post delaminates. This may lead to the nonlinear nature of this sample. On the other hand, when t is thicker, more of the PDMS directly below the inset will delaminate, but the PDMS around the side of the inset will remain in contact.

Figure 13:
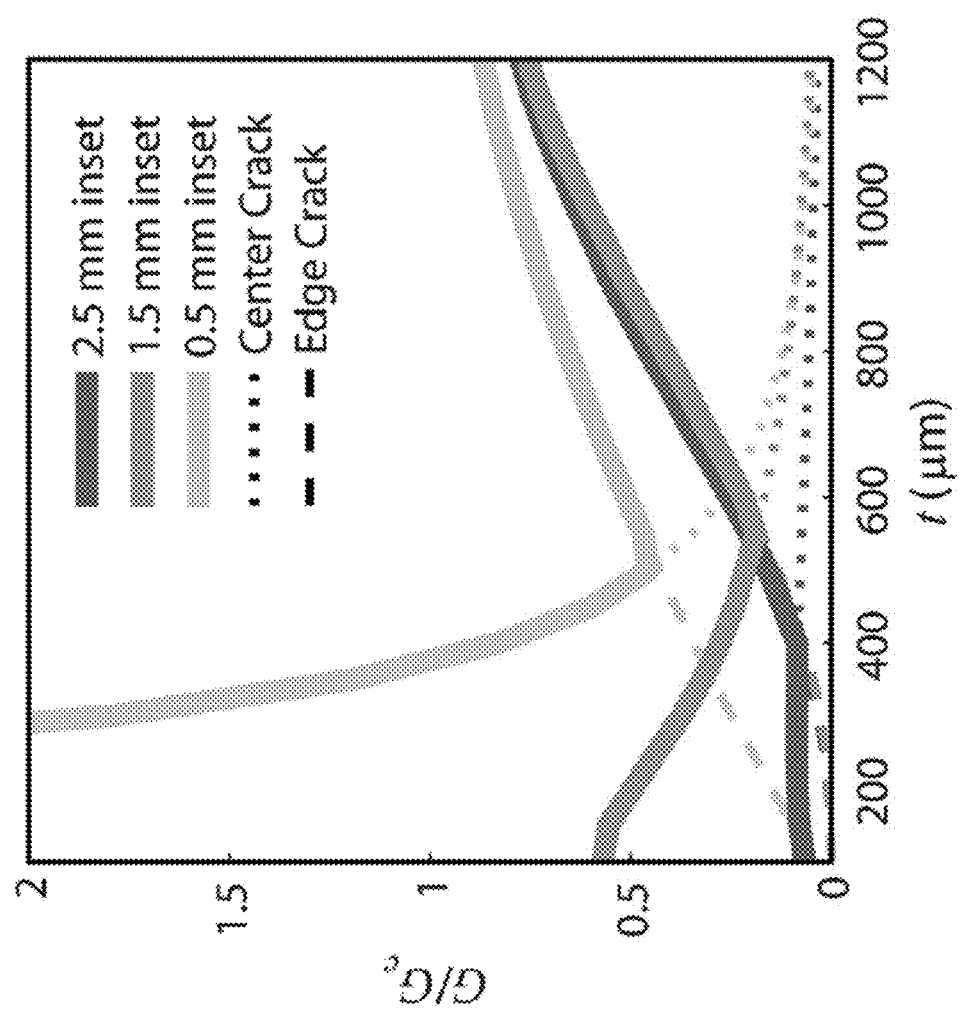
FIG. 13 is a graphical representation of the normalized strain energy release rates for posts in accordance with aspects of the present invention.

Turning to FIG. 13, the normalized strain energy release rates for center and edge cracks on identical posts were compared. A crack will propagate from the side that has a larger strain energy release rate, thus FE models suggest that for a post with a 2.5 mm inset, crack propagation shifts from the edge to the center if there is less than 500 μm of PDMS below the inset.

Figure 14:
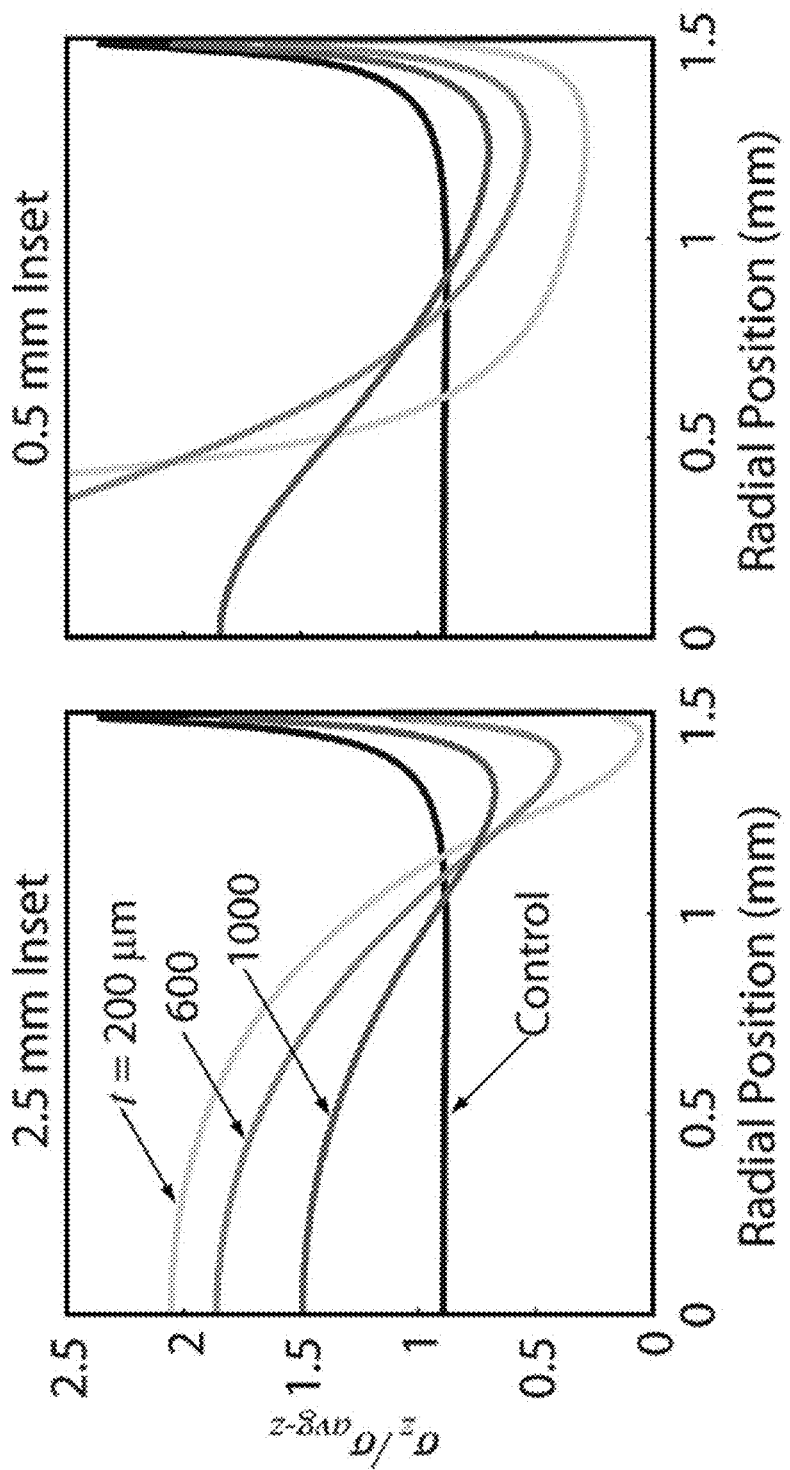
FIG. 14 is a graphical comparison of normal stress over average normal stress at varying radial locations in accordance with aspects of the present invention.

FIG. 14 shows the stress along the interface normalized by the average stress at varying radial distances. Cracks were observed to initiate where the stress concentration was highest.

Figure 15:
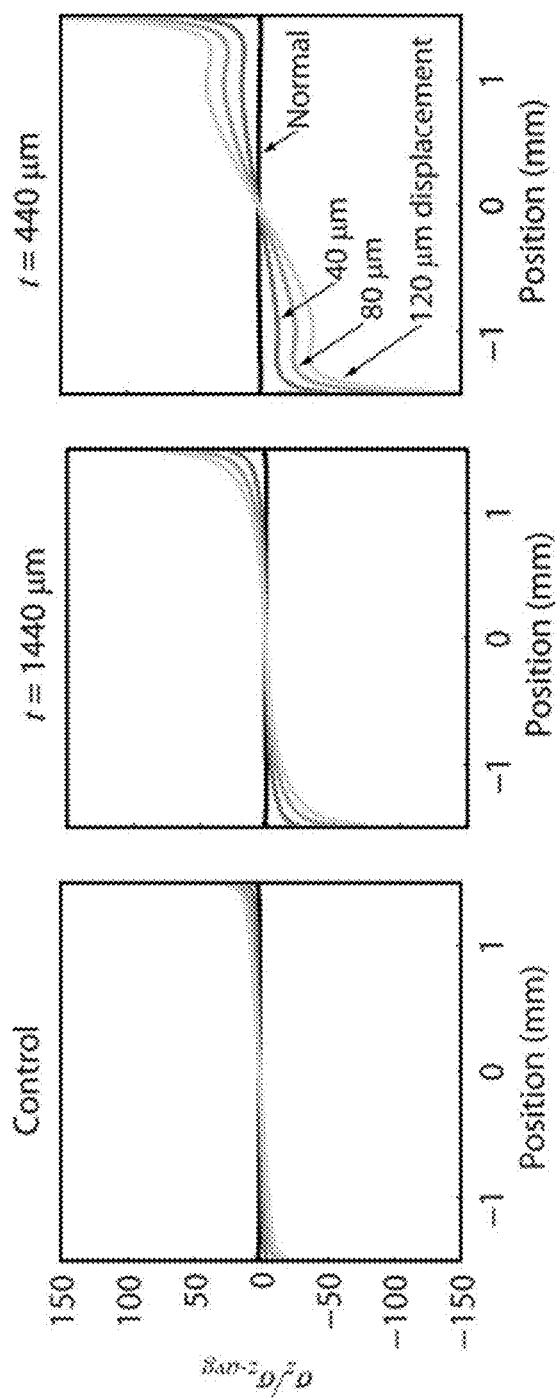
FIG. 15 is a graphical comparison of normal stress over average normal stress at varying radial locations in accordance with aspects of the present invention.
Figures 17A, 17B, 17C:
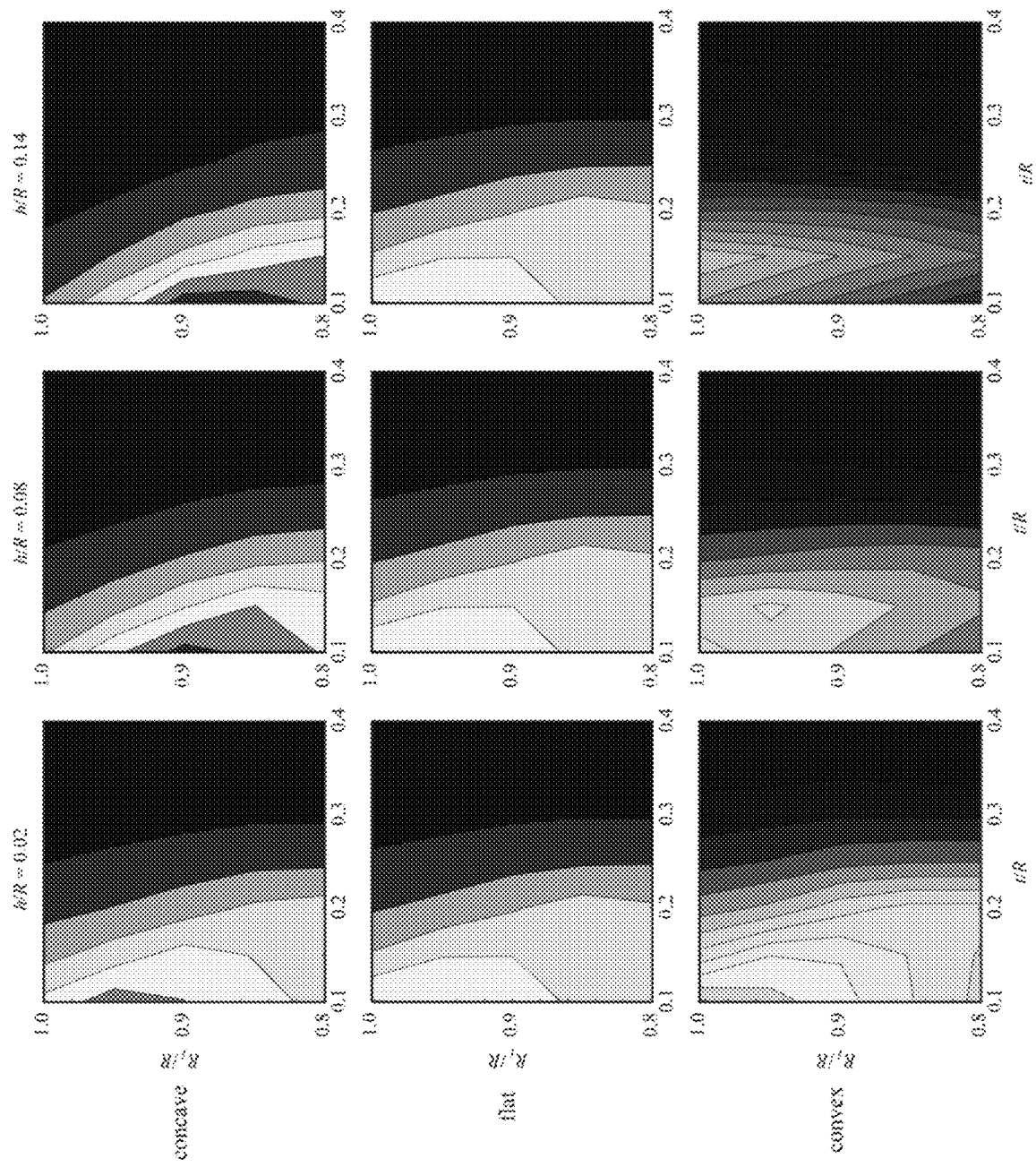
FIG. 17a is a graphical representation of the pull-off force for a composite post having a core with a concave bottom surface and varying h/R values in accordance with aspects of the present invention.
FIG. 17b is a graphical representation of the pull-off force for a composite post having a core with a flat bottom surface and varying h/R values in accordance with aspects of the present invention.
FIG. 17c is a graphical representation of the pull-off force for a composite post having a core with a convex bottom surface and varying h/R values in accordance with aspects of the present invention.

As shear displacement was applied, the stress on the leading side increased while on the trailing side it failed, as depicted by FIG. 15. This discrepancy implies that the crack may initiate on the side with the highest stress. When t is thin (i.e., t=440 μm) there were two peaks in stress, one at the edge of the post and the other at the edge of the inset. The peak edge of the inset grew as the shear displacement increased.

Although the invention is illustrated and described herein with reference to specific embodiments, the invention is not intended to be limited to the details shown. Rather, various modifications may be made in the details within the scope and range of equivalents of the claims and without departing from the invention.

The invention claimed is:

1. A composite post adhesion structure, comprising:
 a post and a backing,
  the post defining a distal end and a proximal end,
  the distal end of the post being attached to the backing,
  the post including
   (i) core comprised of a first material and
   (ii) an outer shell comprised of a second material, the outer shell in contact with and surrounding the core, the core having a Young's modulus at least 50 times greater than the outer shell,
  the post having a radius, r, and the post defining a longitudinal axis,
  the outer shell extending along the longitudinal axis beyond the proximal end of the core by a distance, t, and t/r being less than about 0.45.

2. The composite post of claim 1, wherein the core comprises a bottom surface having a geometry selected from the group consisting of flat, curved, and angular.

3. The composite post of claim 1, wherein the core comprises a core axial centerline and the outer shell comprises an outer shell axial centerline, and wherein the core axial centerline and the outer shell axial centerline are superimposed.

4. A composite post comprising:
 a core comprised of a first material; and
 an outer shell comprised of a second material,
 the outer shell in contact with and surrounding the core,
 the core having a Young's modulus at least 50 times greater than the outer shell,
 wherein the core comprises a core axial centerline and the outer shell comprises an outer shell axial centerline, and
 wherein the core axial centerline and the outer shell axial centerline are shifted from each other.

* * * * *